United States Patent [19]

Majumdar et al.

[11] Patent Number: 5,786,973
[45] Date of Patent: Jul. 28, 1998

[54] SEMICONDUCTOR POWER MODULE AND COMPOUND POWER MODULE

[75] Inventors: Gourab Majumdar, Tokyo; Takashi Marumo, Fukuoka, both of Japan

[73] Assignee: Mitsubishi Denki Kabushiki Kaisha, Tokyo, Japan

[21] Appl. No.: 629,756

[22] Filed: Apr. 9, 1996

[30] Foreign Application Priority Data

Oct. 31, 1995 [JP] Japan ................................ 7-283546

[51] Int. Cl.$^6$ .................................................. H02H 3/00
[52] U.S. Cl. .................................... 361/100; 307/86
[58] Field of Search ............................ 361/18, 23, 31, 361/33, 88, 100, 101; 307/85, 86, 87; 363/57, 58

[56] References Cited

U.S. PATENT DOCUMENTS 5,055,721  10/1991  Majumdar et al. ............... 307/570
5,608,595   3/1997  Gourab et al. ................... 361/88

OTHER PUBLICATIONS

Docket No. 57-1977-2YY U.S. application No. 08/597,128 filed Feb. 06, 1996 pending.
Docket No. 57-2002-2YY U.S. application No. 08/629,756 filed Apr. 09, 1996 pending.

*Primary Examiner*—Jeffrey A. Gaffin
*Assistant Examiner*—Sally C. Medley
*Attorney, Agent, or Firm*—Oblon, Spivak, McClelland, Maier & Neustadt, P.C.

[57] ABSTRACT

A semiconductor power module is configured to prevent concentration of load in a certain semiconductor power switching element. A diagnosis circuit (PC) of a module (10a or 10b) compares a sensing signal (SSE) for example, which is sent out from a sensing circuit (Se) and is proportional to the collector current of an IGBT element, with a reference voltage, and judges presence or absence of abnormality in the collector current. If abnormal, a shutdown signal ($S_{SD}$) is sent out to a shutdown circuit (SD), and the IGBT element is cut off, and simultaneously an abnormality detection signal ($S_{FO1}$ or $S_{FO2}$) is sent out to the other module (10b or 10a). The diagnosis circuit (PC of the module (10b or 10a) receives the abnormality detection signal ($S_{FO1}$ or $S_{FO2}$), and sends out the shutdown signal ($S_{SD}$) to the shutdown circuit (SD), thereby shutting down the IGBT element. Since the transmission timing of both shutdown signals ($S_{SD}$) coincides, the both IGBT elements are cut off at the same time. Therefore, due to earlier shutdown of one IGBT element, concentration of load in the other delayed IGBT element may be avoided.

20 Claims, 19 Drawing Sheets

4

SEMICONDUCTOR POWER MODULE AND COMPOUND POWER MODULE

BACKGROUND OF THE INVENTION

1. Field of the Invention

The present invention relates to a semiconductor power module suitably used in parallel connection, and a compound power module having plural semiconductor power modules connected with each other in parallel, and particularly relates to an improvement for preventing concentration of load in certain semiconductor power switching elements.

2. Description of the Background Art

A semiconductor power module is a device comprising a semiconductor power switching element for switching a main current, a drive circuit for driving this element, and a protective circuit for protecting this element, all incorporated in one device. To heighten the rated value of the current to be supplied to the load, that is, the rated current, it is effective to compose a compound power module by mutually connecting plural semiconductor power modules in parallel.

FIG. 28 is a block diagram showing a constitution of a conventional compound power module. This compound power module 100 comprises two semiconductor power modules 107a, 107b of identical structure connected parallel to each other. Each one of the modules 107a, 107b possesses one main circuit element 1, and one or plural main circuit elements 2. These main circuit elements 1, 2 are connected parallel to each other, and each one of them possesses an IGBT element, and a free wheel diode (FWD) element connected parallel to this element.

A collector terminal C of the module 107a is connected with collector electrodes of all IGBT elements in the module 107a, and its emitter terminal E is connected with emitter electrodes of all IGBT elements. Similarly, a collector terminal C of the module 107b is connected with collector electrodes of all IGBT elements in the module 107b, and its emitter terminal E is connected with emitter electrodes of all IGBT elements.

The collector terminal C of the module 107a and the collector terminal C of the module 107b are mutually connected, and the both emitter terminals E are also connected with each other. As the two modules 107a, 107b are mutually connected parallel in this way, the current to be supplied into the load are distributed.

The main circuit element 1 is connected with a drive circuit Dr, a shutdown circuit SD, a sensing circuit Se, an overvoltage detecting circuit OV, and an undervoltage detecting circuit UV, and the main circuit element 2 is connected with the drive circuit DR and shutdown circuit SD. Each one of the modules 107a, 107b comprises a temperature detecting circuit OT, an input and output interface (I/O) 104, and a diagnosis circuit 105.

The drive circuit Dr amplifies a drive signal from the I/O 104, and feeds into the gate electrode of the IGBT element. The sensing circuit Se sends out a voltage signal, that is, a sensing signal in a size proportional to the main current flowing in the IGBT element contained in the main circuit element 1. The shutdown circuit SD drives the gate electrode so as to shut down the IGBT element, in response to the shutdown signal delivered from the diagnosis circuit 105. The overvoltage detecting circuit OV detects the magnitude of the voltage between the collector and emitter of the IGBT element. The undervoltage detecting circuit UV detects when the supply voltage of the drive circuit DR or the like is lower than the allowable value.

The temperature detecting circuit OT detects the temperature of a copper base plate not shown, provided in each one of the modules 107a,107b, and sends out a temperature detection signal. The copper base plate is a heat conductive plate affixed to the bottom of a power circuit board not shown on which the main circuit elements 1, 2 are mounted, and functions to release the loss heat generated in the main circuit elements 1, 2 to outside. The amount of heat generated by the circuit portions so small in the generated 2 is so small that is may be ignored, as compared with the main circuit elements 1, 2, that is, So as not to affect the drive circuit Dr, shutdown circuit SD, sensing circuit Se, overvoltage detecting circuit OV, undervoltage detecting circuit UV, I/O 104, and diagnosis circuit 105 by the heat from main circuit elements 1, 2, these circuit portions are arranged on a control circuit board 103 disposed separately from the power circuit board.

The I/O 104 is a circuit portion for relaying between the interface circuit (I/F) 106a provided outside of the modules 107a, 107b and drive circuit Dr, and a control signal from the I/F 106a is transmitted to the drive circuit Dr as drive signal. The diagnosis circuit 105 judges presence or absence of abnormality on the basis of the detection signals from the undervoltage detecting circuit UV, overvoltage detecting circuit OV, sensing circuit Se, and temperature detecting circuit OT, and in the event of abnormality, sends out a shutdown signal to the shutdown circuit SD. At the same time, the diagnosis circuit 105 sends out a notice signal for informing occurrence of abnormality to another interface circuit (I/F) 106b provided outside the modules 107a, 107b.

The I/F 106a and 106b are circuit portions for relaying between the device connected outside of the device 100, that is, an external device, and the modules 107a, 107b, and possess photo coupling elements such as photo couplers. One I/F 106a converts an external input control signal into an input signal suited to the I/O 104, and transmits. The output signal line of the I/F 106a is branched, and connected to the I/O 104 of the modules 107a, 107b, and the input signal sent out from the I/F 106a is put into each I/O 104.

The other I/F 106b converts the notice signal sent out from the diagnosis circuit 105 into a signal suited to an external device, and transmits. The output signal wires of the diagnosis circuit 105 provided in each one of the modules 107a, 107b are joined and connected to a single I/F 106b, and when either diagnosis circuit 105 detects the notice signal, this notice signal is sent out into the external device through the I/F 106b. That is, the external device can recognize if all of the plural modules 107a, 107b are working normally, or one of them is abnormal.

In the conventional compound power module, however, being thus constituted, a time deviation occurs in the action of the modules 107a, 107b in the event of abnormality. FIG. 29 is a timing chart explaining this problem.

FIG. 29 depicts respectively, in the two modules 107a and 107b, waveforms of supply voltages VD1, VD2 of drive circuit Dr, diagnosis circuit 105, and so on, drive signals SDr1, SDr2 fed into the drive circuit Dr, notice signals SF01, SF02 sent out from the diagnosis circuit 105, copper base plate temperatures Tb1, Tb2 detected by the temperature detecting circuit OT, gate-emitter voltages VGE1, VGE2 of IGBT element, and main currents flowing in the IGBT element, that is, collector currents IC1, IC2. In FIG. 29, meanwhile, voltage waveforms are drawn for the drive signals SDr1, SDr2, and current waveforms for notice signals SF01, SF02.

As shown in FIG. 29, when the power is supplied into the device 100, the supply voltages VD1,VD2 start up. When the supply voltages VD1, VD2 exceed a certain value, the undervoltage detecting circuit UV is ready to work. The undervoltage detecting circuit UV detects that the supply voltages VD1, VD2 are below the allowable value, and sends out the detection signal to the diagnosis circuit 105. The diagnosis circuit 105 detects occurrence of abnormality on the basis of the detection signal, and outputs notice signals SF01, SF02.

When the supply voltages VD1, VD2 reach the normal value, the undervoltage detecting circuit UV stops transmission of detection signal. As a result, the diagnosis circuit 105 stops transmission of notice signals SF01, SF02. FIG. 29 shows the process of rise and recovery of notice signals SF01, SF02 in the process of rise of supply voltages VD1, VD2.

After transferring to normal action, if the supply voltage VD1 drops in a short time width not causing trouble in action of the drive circuit DR and others, the undervoltage detecting circuit UV does not send out detection signal, and the device 100 continues normal action. In the normal action period, when the drive signals SDr1, SDr2 are at low level corresponding to active level, the IGBT element conducts, and the collector currents IC1, IC2 increase accordingly. To the contrary, when the drive signals SDr1, SDr2 are at high level corresponding to normal level, the IGBT element shuts down, and hence the collector currents IC1, IC2 are pulled back to zero.

In the time indicated by "UV" in FIG. 29, when the supply voltage VD2 drops in a time width not allowable for operation of the drive circuit Dr or the like, this abnormality is detected by the undervoltage detecting circuit UV of the module 107b. As a result, the diagnosis circuit 105 of the module 107b sends out notice signal SF02. At the same time, the diagnosis circuit 105 of the module 107b sends shutdown signal to the shutdown circuit SD.

In the example in FIG. 29, in the period before and after time UV, the drive signals SDr1, SDr2 are at low level corresponding to active level. Therefore, at least before the shutdown circuit SD is put in action, the IGBT elements of both modules 107a, 107b are in conductive state, and the collector currents IC1, IC2 are in the ascending process. Afterwards, when the shutdown circuit SD of the module 107b acts in response to the shutdown signal, the IGBT element of one module 107b shuts down, and the collector current IC2 decreases to zero.

In the other module 107a, however, since the shutdown circuit SD does not work, the IGBT element continues conduction. Accordingly, the collector current IC1 continues to ascend. Moreover, since the IGBT element of the one module 107b shuts down, the current feeding to the load is concentrated on the IGBT element of the other module 107a. As a result, the collector current IC1 elevates excessively. That is, the problem is that an excessive load is applied to the IGBT element of the module 107a that has not shut down.

Suppose, in the event of an abnormality of short-circuiting of the load, the drive signals SDr1, SDr2 become low level, and the IGBT elements of both modules 107a, 107b are made to conduct. In this case, in both modules 107a and 107b, the collector current of the IGBT ascends excessively. As a result, in each one of the modules 107a and 107b, the diagnosis circuit 105 detects occurrence of abnormality on the basis of the sensing signal from the sensing circuit Se (the SC time in FIG. 29). Hence, by the function of the shutdown circuit SD, the IGBT elements of the modules 107a, 107b are cut off.

However, in both modules 107a and 107b, the timing for judging occurrence of abnormality by the diagnosis circuit 105 does not always coincide. Accordingly, a deviation is caused in the timing of cutting off the IGBT elements belonging to the modules 107a, 107b. As a result, an excessive load is applied to the IGBT element delayed in the shutdown timing (the IGBT element of the module 107b in the example in FIG. 29).

FIG. 30 is a timing chart showing a magnified view of waveforms of the collector-emitter voltages VCE1, VCE2 and the collector currents IC1, IC2 in the period before and after time SC. As shown in FIG. 30, the collector current IC2 of the IGBT element of the module 107b delayed in the shutdown period is excessively elevated. That is, the current for feeding to the load is concentrated on the IGBT element delayed in the shutdown timing.

Back to FIG. 29, when the IGBT element turns from conduction to shutdown, an excessive voltage may be applied between the collector electrode and emitter electrode (the time indicated by OV). For example, if the wiring for connecting the collector terminal C, emitter terminal E and load is usually long, or if the surge absorption circuit (not shown) inserted between the collector terminal C and emitter terminal E does not function sufficiently, such excessive voltage may be generated.

On the basis of the detected values of the collector-emitter voltages VCE1, VCE2 detected by the overvoltage detecting circuits OV of the modules 107a and 107b, the diagnosis circuits 105 detect occurrence of excessive voltage. However, in both modules 107a and 107b, the timing for detecting abnormality by the diagnosis circuits 105 does not always coincide. Therefore, in both, a deviation occurs in the timing of transition of the IGBT element from conduction to shutdown. As a result, the current to feed to the load is concentrated on the IGBT element delayed in shutdown timing, and hence the collector current climbs up abnormally. FIG. 29 shows an example of abnormal rise of the collector current IC2 due to delay in shutdown timing of the IGBT element belonging to the module 107b.

Next, during normal action, when the temperature of the copper base plate rises to an abnormal level, the diagnosis circuit 105 detects onset of abnormality on the basis of the temperature detection signal sent out by the temperature detecting circuit OT (the time indicated by OT). As shown in FIG. 29, supposing the IGBT elements of the modules 107a, 107b be in conductive state up to just before the time OT, these IGBT elements are changed from conductive state to shutdown state by the function of the diagnosis circuit 105 and shutdown circuit SD. Thus, the IGBT elements and others are protected from abnormal temperature rise.

However, in both modules 107a and 107b, the timing for detecting abnormality by the diagnosis circuits 105 does not always coincide. Therefore, in both, a deviation occurs in the timing of transition of the IGBT element from conduction to shutdown. As a result, the current to feed to the load is concentrated on the IGBT element delayed in shutdown timing, and hence the collector current climbs up abnormally. FIG. 29 shows an example of abnormal rise of the collector current IC2 due to delay in shutdown timing of the IGBT element belonging to the module 107b.

As described herein, in the conventional compound power module, a time deviation occurs in the protective action when an abnormality occurs, between the semiconductor power modules connected parallel, and hence the load is concentrated on the semiconductor power switching element belonging to one module.

Moreover, although not shown in FIG. 29, in the conventional device, even during normal action, there was a difference in the propagation delay time of input signal between two modules, due to, for example, difference in the wiring length from the IF 106a to I/O 104 between the two modules 107a and 107b. As a result, a deviation occurred between the time when the input signal being entered into the I/O 104 changed in one module and the time in the other one. Accordingly, a deviation occurred between the time when the IGBT element conducted or shut down in response to the control signal entered into the I/F 106a in one module and the time in the other module, and hence the load was transitionally concentrated in certain IGBT elements even during normal action.

SUMMARY OF THE INVENTION

To this end, a semiconductor power module, as discussed herein, is configured to prevent concentration of load in a certain semiconductor power switching element. A diagnosis circuit (PC) of a module is configured to compare a sensing signal (SSE) for example, which is sent out from a sensing circuit (Se) and is proportional to the collector current of an IGBT element, with a reference voltage, and judges presence or absence of an abnormality in the collector current. If abnormal, a shutdown signal ($S_{SD}$) is sent out to a shutdown circuit (SD), and the IGBT element is cut off, and simultaneously an abnormality detection signal ($S_{FO1}$ or $S_{FO2}$) is sent out to the other module. The diagnosis circuit (PC) of the module receives the abnormality detection signal ($S_{FO1}$ or $S_{FO2}$), and sends out the shutdown signal ($S_{SD}$) to the shutdown circuit (SD), thereby shutting down the IGBT element. Since the transmission timing of both shutdown signals ($S_{SD}$) coincide, both IGBT elements are cut off at the same time. Therefore, due to earlier shutdown of one IGBT element, concentration of load in the other delayed IGBT element is avoided.

A first aspect of the present invention relates to a semiconductor power module comprising a semiconductor power switching element for switching a main current, a drive circuit for driving the element, and a protective circuit for protecting the element from damage in the event of abnormality, further comprising plural input terminals, an output terminal, a selection circuit for selecting a most delayed control signal among plural control signals entered from outside into the plural input terminals, and transmitting the control signal selected to the drive circuit, and a transmission route for transmitting one of the plural control signals entered in the selection circuit into the output terminal.

A second aspect of the present invention relates to a semiconductor power module comprising a semiconductor power switching element for switching a main current, a drive circuit for driving the element, and a protective circuit for protecting the element from damage in the event of abnormality, further comprising at least one input terminal coupled to the protective circuit, and an output terminal coupled to the protective circuit, wherein the protective circuit comprises a shutdown circuit for driving to shut down the element, prior to the action of the drive circuit, when a shutdown signal is inputted, at least one detecting circuit for detecting the quantity of at least one type related to the action of the element, and a diagnosis circuit, and the diagnosis circuit comprises at least one comparator for comparing the quantity of at least one type detected by the at least one detecting circuit with each reference value, and outputting a signal corresponding to whether an abnormality has occurred or not, and a judging circuit for sending out the shutdown signal to the shutdown circuit, and sending out an abnormality detecting signal to the output terminal, either when any one of the at least one comparator outputs a signal corresponding to occurrence of abnormality, or when a specific signal is inputted into any one of the at least one input terminal.

A third aspect of the present invention relates to a semiconductor power module of the second aspect, further comprising one more input terminal, one more output terminal, and an interface circuit for distributing and transmitting the control signal inputted from outside into the one more input terminal into the drive circuit and the one more output terminal.

A fourth aspect of the present invention relates to a semiconductor power module comprising a semiconductor power switching element for switching a main current, a drive circuit for driving the element, a protective circuit for protecting the element from damage in the event of abnormality, further comprising an input terminal coupled to the protective circuit, and an output terminal coupled to the protective circuit, wherein the protective circuit comprises a shutdown circuit for driving to shut down the element, prior to action of the drive circuit, when a shutdown signal is inputted into the input terminal, a detecting circuit for detecting the quantity relating to the action of the element, and a diagnosis circuit, and the diagnosis circuit comprises a comparator for comparing the quantity detected by the detecting circuit with a reference value, and outputting a signal corresponding to whether an abnormality has occurred or not, and a judging circuit for sending out an abnormality detection signal to the output terminal when the comparator outputs a signal corresponding to occurrence of abnormality.

A fifth aspect of the present invention relates to a semiconductor power module of the second or fourth aspect, wherein a circuit block comprising the detecting circuit, the drive circuit, and the shutdown circuit is integrated in one semiconductor chip.

A sixth aspect of the present invention relates to a semiconductor power module of the first aspect, wherein the selection circuit comprises an AND circuit for receiving the plural control signals, a NOR circuit for receiving the plural control signals, and an RS latch circuit for receiving the outputs of the AND circuit and the NOR circuit at a set terminal and a reset terminal, respectively, feeding its output to the drive circuit.

A seventh aspect of the present invention relates to a compound power module comprising plural semiconductor power modules connected with each other in parallel, wherein each one of the plural semiconductor power modules is a semiconductor power module of the first aspect, the number of the plural semiconductor power modules is not more than the number of the plural input terminals possessed by each one of the plural semiconductor power modules, one of the plural input terminals of each of the plural semiconductor power modules is mutually connected among the plural semiconductor power modules, and the output terminal of each of the plural semiconductor power modules is connected to one of the plural input terminals other than the one of the same mutually connected of each one of all other semiconductor power modules, so as not to overlap with the output terminal of any other semiconductor power module.

An eighth aspect of the present invention relates to a compound power module comprising plural semiconductor power modules connected with each other in parallel, wherein each one of the plural semiconductor power modules is a semiconductor power module of the second aspect, the number of the plural semiconductor power modules is not more than the number adding 1 to the number of the at least one input terminal possessed by each one of the plural semiconductor power modules, and the output terminal of each of the plural semiconductor power modules is connected to one of the at least one input terminal of each one of all other semiconductor power modules, so as not to overlap with the output terminal of any other semiconductor power module.

A ninth aspect of the present invention relates to a compound power module comprising plural semiconductor power modules connected with each other in parallel, wherein a main module being one of the plural semiconductor modules is a semiconductor power module of the second aspect, each one of at least one subsidiary module being all other semiconductor power modules is a semiconductor power module of the fourth aspect, the number of the at least one subsidiary module is not more than the number of the at least one input terminal of the main module, the output terminal of the main module is connected to the input terminal of each one of the at least one subsidiary module, and the output terminal of each one of the at least one subsidiary module is connected to one of the input terminals of the main module without overlapping.

A tenth aspect of the present invention relates to a compound power module comprising plural semiconductor power modules connected with each other in parallel, wherein a main module being one of the plural semiconductor modules is a semiconductor power module of the third aspect, each one of at least one subsidiary module being all other semiconductor power modules is a semiconductor power module of the fourth aspect, the number of the at least one subsidiary module is not more than the number of the at least one input terminal of the main module, the output terminal of the main module is connected to the input terminal of each one of the at least one subsidiary module, the output terminal of each one of the at least one subsidiary module is connected to one of the input terminals of the main module without overlapping, and the one more output terminal of the main module is coupled with the drive circuit of each one of the at least one subsidiary module.

In the module according to the first aspect of the present invention, when a plurality of the modules not more than the number of the input terminals are connected parallel, each one of the plural input terminals can be mutually connected between modules, and the output terminal of each module can be connected to the plural input terminals of all other modules without overlapping. When a control signal is entered from outside to any one of the mutually connected input terminals, or to the portion of wiring for connecting them or the like, this control signal generally reaches each module at mutually different delay time.

However, the control signal inputted into each module is inputted into all other modules, and moreover by the function of the selection circuit, the signal reaching latest of the plural input control signals is selected, and transmitted to the drive circuit, and therefore the timing of input of control signal into the drive circuit is matched in all modules. Hence, the action of the semiconductor power switching element in normal state when driven by the drive circuit is done simultaneously in all modules. Accordingly, the problem of concentration of load in certain elements in normal state seen in the conventional device can be eliminated.

In the module according to the second aspect of the present invention, when a plurality of the modules not more than the number adding 1 to the number of the input terminals are connected parallel, the output terminal of each module can be connected to one of the input terminals of all other modules without overlapping. At this time, if abnormality occurs in any one module, the judging circuit in this module sends out a shutdown signal to the shutdown circuit in this module, and sends out an abnormality detection signal to all other modules.

In all other modules, since this abnormality detection signal is entered as the specific signal, and the judging circuit sends out the shutdown signal to the shutdown circuit. Therefore, shutdown signals are sent out simultaneously in all modules including the module causing abnormality, and the semiconductor power switching elements are cut off at the same time. Accordingly, the problem of concentration of load in a certain element in the event of abnormality seen in the conventional device can be eliminated.

In the module according to the third aspect of the present invention, using the module of the third aspect as a main module and the module of the fourth aspect as a subsidiary module, it is suited to use by connecting parallel the main module and the subsidiary module not more than the number of the input terminals of the main module. In such parallel connection, the output terminal of the main module is connected to each input terminal of the subsidiary module, each output terminal of the subsidiary module can be connected to one of the input terminals of the main module without overlapping, and the one more output terminal of the main module can be coupled with the drive circuit of each subsidiary module.

At this time, when abnormality occurs in the main module, the judging circuit in this main module sends out a shutdown signal to the shutdown circuit in this module, and sends out an abnormality detection signal to all subsidiary modules. In all subsidiary modules, since this abnormality detection signal is entered as the shutdown signal, the shutdown signals are put into the shutdown circuits in all modules including the module causing abnormality. That is, in the event of abnormality, the semiconductor power switching elements are cut off simultaneously.

If an abnormality occurs in any one of the subsidiary modules, an abnormality detection signal is sent out from this subsidiary module to the main module. As a result, in the main module, a shutdown signal is sent out to the shutdown circuit, -and an abnormality detection signal is sent out to all subsidiary modules, and therefore shutdown signals are put into the shutdown circuits in all modules including the module causing abnormality. Accordingly, the problem of concentration of load in a certain element in the event of abnormality seen in the conventional device can be eliminated.

Incidentally, when a control signal is put into the one more input terminal of the main module, this control signal is transmitted to the drive circuit, and is further put into the drive circuits of all subsidiary modules through the one more output terminal. Accordingly, deviation of the timing of control signal reaching the drive circuits among modules is lessened. That is, the problem of concentration of load in a certain element in normal state seen in the conventional device can be relieved.

The module according to the fourth aspect of the present invention is suited to be used by parallel connection with the module of the third aspect, in a form described in relation to the third aspect of the present invention.

In the module according to the fifth aspect of the present invention, since the circuit block comprising the detecting circuit, drive circuit, and shutdown circuit is integrated in one semiconductor chip (one-chip design), not only the size and cost of the modules are reduced, but also the reliability of the modules is enhanced.

In the module according to the sixth aspect of the present invention, since the selection circuit is composed in a simple logic operation circuit, the selection circuit can be manufactured inexpensively and easily.

In the compound module according to the seventh aspect of the present invention, a plurality of modules of the first aspect not more than the number of the input terminals are connected parallel, one of the plural input terminals is mutually connected among the modules, and the output terminal of each module is connected to one of other plural input terminals of each of all other modules without overlapping. When a control signal is entered from outside into any one of the mutually connected input terminals, or into the wiring portion for connecting them or the like, this control signal generally reaches each module at mutually different delay time.

However, the control signal inputted into each module is inputted into all other modules, and moreover by the function of the selection circuit, the signal reaching latest of the plural input control signals is selected, and transmitted to the drive circuit, and therefore the timing of input of control signal into the drive circuit is matched in all modules. Hence, the action of the semiconductor power switching element in normal state when driven by the drive circuit is done simultaneously in all modules. Accordingly, the problem of concentration of load in a certain element in normal state seen in the conventional device can be eliminated.

In the compound module according to the eighth aspect of the present invention, a plurality of modules of the second aspect not more than the number adding 1 to the number of the input terminals are connected parallel, and the output terminal of each module is connected to one of the input terminals of all other modules without overlapping. Therefore, if abnormality occurs in any one module, the judging circuit in this module sends out a shutdown signal to the shutdown circuit in this module, and sends out an abnormality detection signal to all other modules.

In all other modules, since this abnormality detection signal is entered as the specific signal, and the judging circuit sends out the shutdown signal to the shutdown circuit. Therefore, shutdown signals are sent out simultaneously in all modules including the module causing abnormality, and the semiconductor power switching elements are cut off at the same time. Accordingly, the problem of concentration of load in a certain element in the event of abnormality seen in the conventional device can be eliminated.

In the compound module according to the ninth aspect of the present invention, using the module of the second aspect as a main module and the module of the fourth aspect as a subsidiary module, the main module and the subsidiary module not more than the number of the input terminals of the main module are connected parallel. Moreover, the output terminal of the main module is connected to each input terminal of the subsidiary module, each output terminal of the subsidiary module is connected to one of the input terminals of the main module without overlapping.

Accordingly, when abnormality occurs in the main module, the judging circuit in this main module sends out a shutdown signal to the shutdown circuit in this module, and sends out an abnormality detection signal to all subsidiary modules. In all subsidiary modules, since this abnormality detection signal is entered as the shutdown signal, the shutdown signals are put into the shutdown circuits in all modules including the module causing abnormality. That is, in the event of abnormality, the semiconductor power switching elements are cut off simultaneously.

If an abnormality occurs in any one of the subsidiary modules, an abnormality detection signal is sent out from this subsidiary module to the main module. As a result, in the main module, a shutdown signal is sent out to the shutdown circuit, and an abnormality detection signal is sent out to all subsidiary modules, and therefore shutdown signals are simultaneously put into the shutdown circuits in all modules including the module causing abnormality. Accordingly, the problem of concentration of load in a certain element in the event of abnormality seen in the conventional device can be eliminated.

In the compound module according to the tenth aspect of the present invention, using the module of the third aspect as a main module and the module of the fourth aspect as a subsidiary module, the main module and the subsidiary module not more than the number of the input terminals of the main module are connected parallel. Moreover, the one more output terminal of the main module is coupled to the drive circuit of each subsidiary module.

Accordingly, when a control signal is put into the one more input terminal of the main module, this control signal is transmitted to the drive circuit, and is further put into the drive circuits of all subsidiary modules through the one more output terminal. Hence, deviation of the timing of control signal reaching the drive circuits among modules is lessened. That is, the problem of concentration of load in a certain element in normal state seen in the conventional device can be relieved.

It is therefore an object of the present invention to solve the problems of the conventional device and provide a compound power module capable of avoiding concentration of load in certain semiconductor power switching elements, by eliminating timing deviation of action of the semiconductor power switching elements in normal action and in occurrence of abnormality, and a semiconductor power module suited to such compound power module.

These and other objects, features, aspects and advantages of the present invention will become more apparent from the following description of the present invention when taken in conjunction with the accompanying drawings.

DESCRIPTION OF THE PREFERRED EMBODIMENTS

<1. Preferred embodiment 1>

A compound power module in preferred embodiment 1 is described in the first place.

<1.1 General constitution of device>

Figure 1:
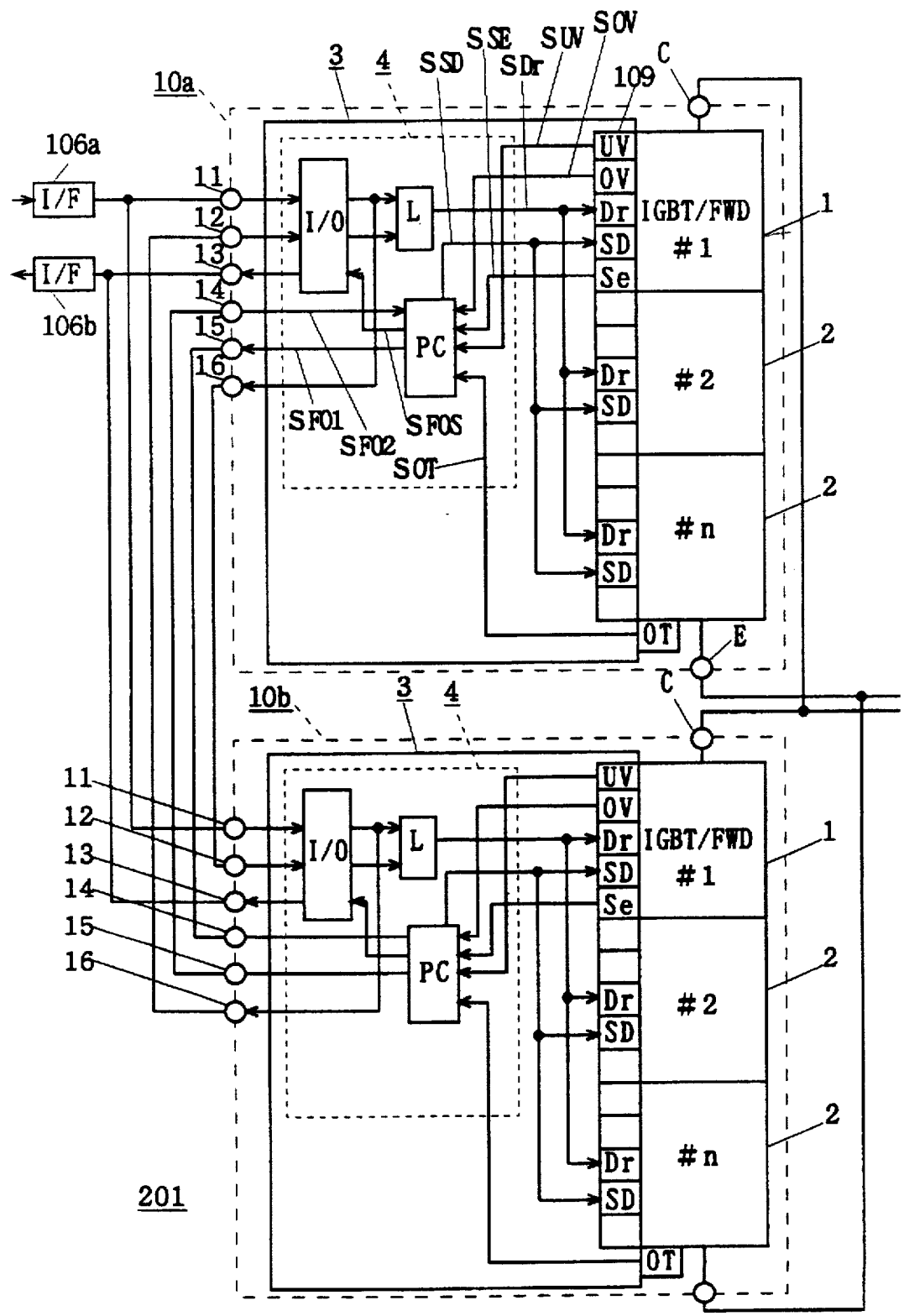
FIG. 1 is a block diagram showing a constitution of a device in preferred embodiment 1 of the present invention.
Figure 28:
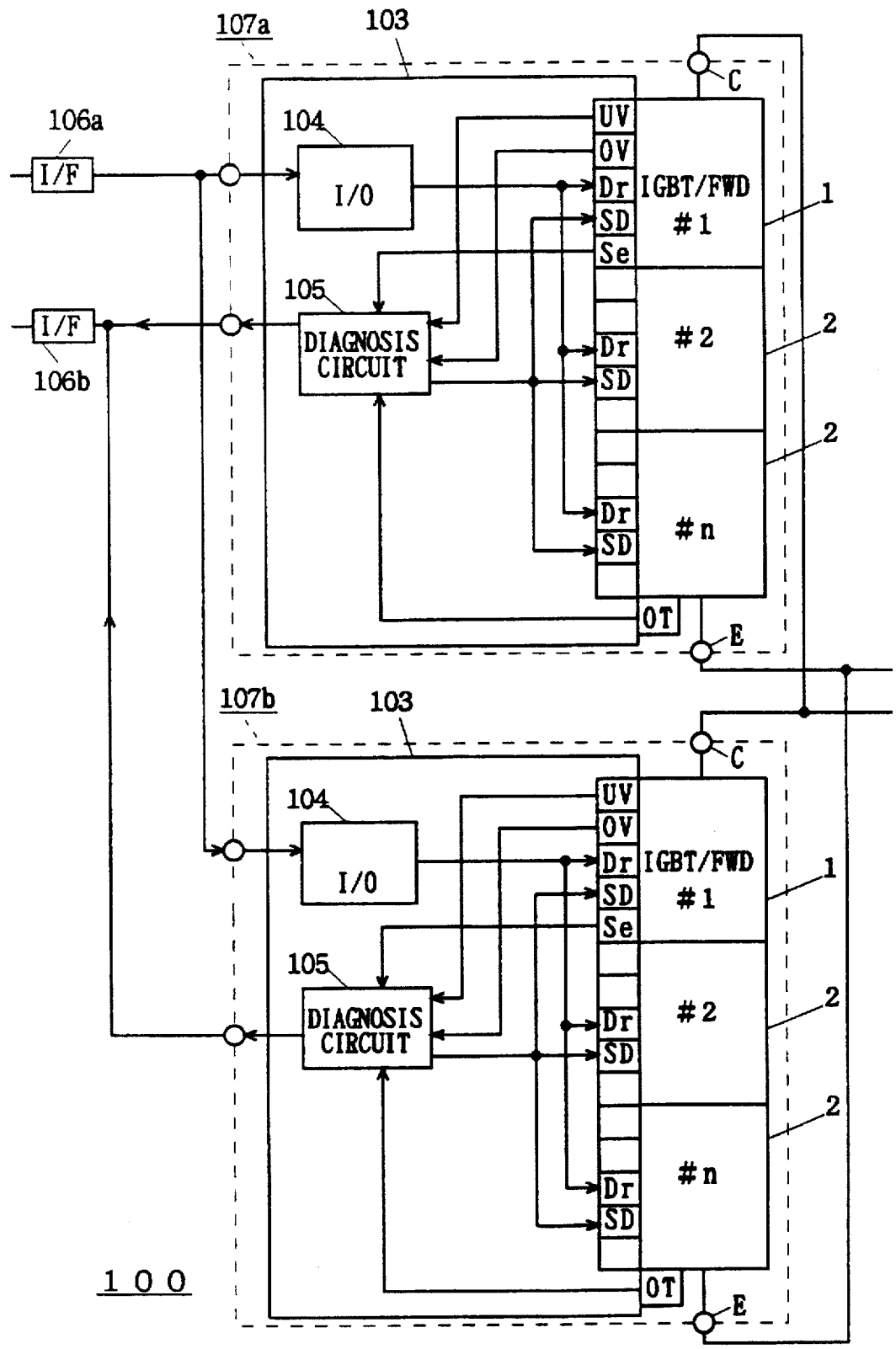
FIG. 28 is a block diagram showing a constitution of a conventional device.

FIG. 1 is a block diagram showing a constitution of the compound power module in preferred embodiment 1. This compound power module 201 comprises two semiconductor power modules 10a, 10b of identical structure connected parallel to each other. Each one of the modules 10a, 10b possesses one main circuit element 1, and one or plural main circuit elements 2. These main circuit elements 1, 2 are identical in structure with the elements given same reference numerals in FIG. 28, and are connected parallel to each other same as in the conventional device in FIG. 28.

To the collector terminal C provided in the module 10a, collector electrodes of all IGBT elements in the module 10a are connected, and to the emitter terminal E, emitter electrodes of all IGBT elements are connected. Similarly, to the collector terminal C provided in the module 10b, collector electrodes of all IGBT elements in the module 10b are connected, and to the emitter terminal E, emitter electrodes of all IGBT elements are connected.

The collector terminal C of the module 10a and the collector terminal C of the module 10b are connected with each other, and the both emitter terminals E are also connected with each other. In this way, as the two modules 10a, 10b are connected parallel to each other, the current to feed to the load is distributed.

Figure 2:
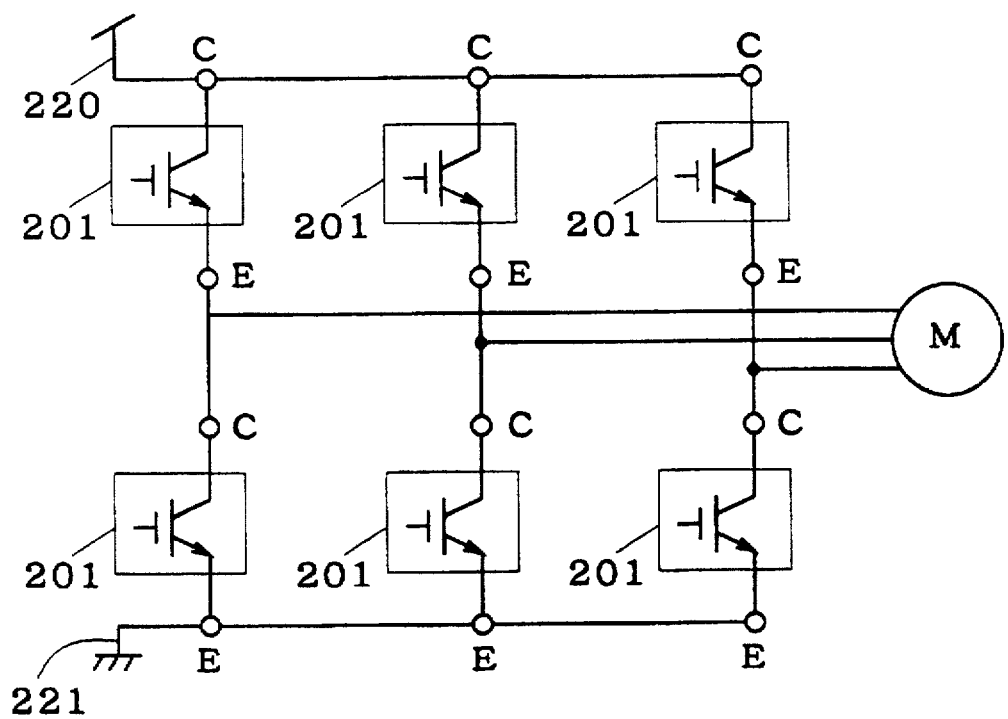
FIG. 2 is a circuit diagram showing connection of the device in FIG. 1 and a load.

FIG. 2 is a circuit diagram showing the relation between a device 201 and a load in an inverter as a representative mode of use of the device 201. As shown in FIG. 2, in the inverter, three pieces of a series circuit composed by connecting two devices 201 in series each are inserted parallel between a high potential power source wire 220 and a low potential power source wire 221. The collector terminal C of one of the two devices 201 composing the series circuit is connected to the high potential power source wire 220, and the emitter terminal E of the other one is connected to the low potential power source wire 221. The junction of the two devices 201 composing the series circuit is connected to a load M such as a motor.

Each device 201 is connected to an external device not shown, and a control signal instructing shutdown and conduction is supplied from this external device into the device 201. This control signal is entered so that the two devices 201 composing each series circuit may conduct and shut down alternately, and that the action phase differs by 120 degrees each among three series circuits. As a result, the load M as three-phase motor is driven appropriately.

Back to FIG. 1, the main circuit element 1 is connected with drive circuit Dr, shutdown circuit SD, sensing circuit Se, overvoltage detecting circuit OV, and undervoltage detecting circuit UV, and the main circuit element 2 is connected with the drive circuit Dr and shutdown circuit SD. Each one of the modules 10a, 10b is provided with temperature detecting circuit OT, input and output interface I/O, logic circuit L, and diagnosis circuit PC.

The drive circuit Dr amplifies signal from the logic circuit L, and feeds a drive signal Dr into the gate electrode of the IGBT element. The sensing circuit Se sends out a voltage signal, that is, sensing signal $S_{SE}$, in a magnitude proportional to the main current flowing in the IGBT element contained in the main circuit element 1. The shutdown circuit SD drives the gate electrode so as to shut down the IGBT element, in response to the shutdown signal $S_{SD}$ delivered from the diagnosis circuit PC. The overvoltage detecting circuit OV detects the magnitude of the collector-emitter voltage of the IGBT element, and sends out a detection signal $S_{OV}$. Moreover, the undervoltage detecting circuit UV detects when the supply voltage of the drive circuit Dr or the like is lower than the allowable value, and sends out a detection signal $S_{UV}$.

The temperature detecting circuit OT detects the temperature of the copper base plate, not shown, provided in each one of the modules 10a, 10b, and sends out a temperature detection signal $S_{OT}$. The copper base plate is a heat conductive plate affixed to the bottom of the power circuit board, not shown, on which the main circuit elements 1, 2 are mounted, and functions to release the loss heat generated in the main circuit elements 1, 2 to outside.

The circuit parts of which heat generation is as small as negligible as compared with the main circuit elements 1, 2, that is, the drive circuit Dr, shutdown circuit SD, sensing circuit Se, overvoltage detecting circuit OV, undervoltage detecting circuit UV, input and output interface I/O, logic circuit L, and diagnosis circuit PC are spread on a control circuit board 3 provided separately from the power circuit board.

The input and output interface I/O is a circuit portion for relaying between I/F 106a, 106b provided outside the modules 10a, 10b and other modules connected parallel, and the logic circuit L and diagnosis circuit PC. An output signal wire of the I/F 106a is branched, and connected to the input and output interface I/O of the modules 10a, 10b through individual terminal 11. The control signal entered from an external device is converted in the I/F 106a, and is put into each input and output interface I/O belonging to the modules 10a, 10b. This input signal passes through the input and output interface I/O, and is sent out to the logic circuit L, and is also sent out to other module terminal 12 through a terminal 16.

In the input and output interface I/O, together with the above input signal entered from the I/F 106a through the terminal 11, the output signal of the input and output interface I/O belonging to other module connected parallel is entered through the terminal 12. These two input signals are fed into the logic circuit L through the input and output interface I/O.

The logic circuit L selects the latest signal of two input signals, that is, the output signals of both input and output interfaces I/O of the modules 10a, 10b connected parallel, and sends it out to the drive circuit Dr. Accordingly, between the two modules 10a, 10b connected parallel, it is advantageous that the actions in normal state are done mutually in synchronism, without time deviation in the conduction and shutdown actions (on, off actions) in normal state of the IGBT element.

The diagnosis circuit PC judges presence or absence of abnormality on the basis of various detection signals from the undervoltage detecting circuit UV, overvoltage detecting circuit OV, sensing circuit Se, and temperature detecting circuit OT, and sends out, in the event of abnormality, a shutdown signal SD to the shutdown circuit SD. As a result, the IGBT element changes to shutdown state, so that breakdown or damage of the IGBT element due to action in abnormality may be avoided.

The diagnosis circuit PC sends out, further in the event of abnormality, a notice signal $S_{FOS}$ to the interface circuit 106b through input and output interface I/O and terminal 13, and moreover sends out an abnormality detection signal $S_{FO1}$ (for example, in the case of module 10a) to the diagnosis circuit PC belonging to other module connected parallel through terminal 15. The diagnosis circuit PC receives, together with various detection signals from the undervoltage detecting circuit UV and others, an abnormality detection signal $S_{FO2}$ sent out from the diagnosis circuit PC belonging to other module (for example, 10b) connected parallel through terminal 14. When the abnormality detection signal $S_{FO2}$ is put into the diagnosis circuit PC, the shutdown signal $S_{SD}$ is sent out into the shutdown circuit SD.

In this way, the judging result of each diagnosis circuit PC of the modules 10a, 10b connected parallel is put into the opposite diagnosis circuit PC, and when abnormality occurrence is detected in one diagnosis circuit PC, abnormality occurrence is also detected in the other diagnosis circuit PC in response, and the both diagnosis circuits PC simultaneously send a shutdown signal $S_{SD}$ to the shutdown circuits SD. Hence, in the event of abnormality, the IGBT elements are cut off simultaneously in the modules 10a, 10b. That is, the problem of concentration of load in a certain IGBT element in the event of abnormality experienced in the conventional device is eliminated.

Signal wires for transmitting notice signal $S_{FOS}$ of the diagnosis circuits PC in the modules 10a, 10b are mutually converged and connected with a single I/F 106b, and when either diagnosis circuit PC sends out a notice signal $S_{FOS}$, a converted signal is sent out to the external device. That is, the external device can recognize whether all plural modules 10a, 10b are working normally, or either one of them is abnormal.

Incidentally, a circuit block 4 comprising the input and output interface I/O, logic circuit L, and diagnosis circuit PC is preferably integrated in a single semiconductor chip. As a result, not only downsizing and cost reduction of the device are promoted, but also the reliability of the device is enhanced.

<1.2 Constitution of various detecting circuits>

Figure 3:
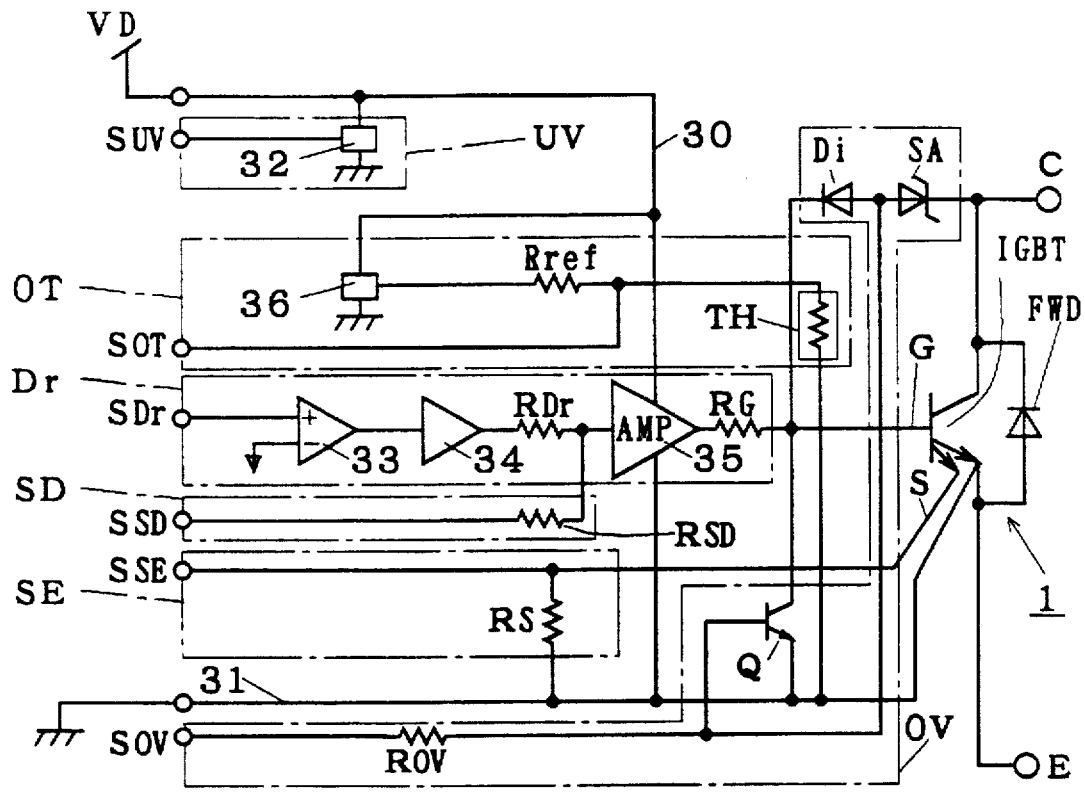
FIG. 3 is a circuit diagram showing a constitution of detecting circuits in the device in FIG. 1.

FIG. 3 is a circuit diagram showing an internal constitution of various detecting circuits including undervoltage detecting circuit UV and others, and main circuit element 1. The main circuit element 1 is composed of an IGBT element, and an FWD element connected parallel thereto. That is, an anode electrode of the FWD element is connected to an emitter electrode of the IGBT element, and the cathode electrode is connected to the collector electrode. The FWD element functions to prevent damage of the IGBT element due to application of inverse voltage.

This main circuit element 1 is connected with undervoltage detecting circuit UV, temperature detecting circuit OT, drive circuit Dr, shutdown circuit SD, sensing circuit Se, and overvoltage detecting circuit OV. The constitution of these circuits is described below together with the operation.

First, in the drive circuit Dr, a drive signal $S_{Dr}$ is compared with a specific reference potential by a comparator 33, and its output is put into an amplifier 35 through a buffer 34 and a resistance $R_{DR}$. The output of the amplifier 35 is put into the gate electrode G of the IGBT element through gate resistance $R_G$. That is, the drive circuit Dr applies a voltage signal for conducting or shutting down the IGBT element across the gate and emitter, depending on whether the drive signal $S_{Dr}$ is higher or lower than the reference potential. Although not shown in the drawing, the drive circuit Dr also comprises a circuit for generating a reference voltage.

In the shutdown circuit SD, a shutdown signal $S_{SD}$ is fed into the amplifier 35 of the drive circuit Dr through resistance $R_{SD}$. Accordingly, when the shutdown signal $S_{SD}$ is at active level, that is, low level, the amplifier 35 shuts down the IGBT element, regardless of the value of the drive signal $S_{Dr}$.

The undervoltage detecting circuit UV comprises a voltage monitoring element 32. As this voltage monitoring element 32, a well-known conventional element can be used, and it is designed to monitor always the voltage across two connected power source wires, that is, a high potential power source wire 30 and a low potential power source wire 31 connected to the emitter electrode of the IGBT element. These power source wires 30, 31 feed a supply voltage $V_D$ of circuit element such as amplifier 35 provided in the drive circuit Dr, and the voltage monitoring element 32 judges if a voltage over an allowable value for guaranteeing the normal action of the drive circuit Dr is supplied or not. The voltage monitoring element 32 outputs a detection signal $S_{UV}$ when the voltage between the power source wires 30, 31 is less than the allowable value.

The sensing circuit Se has a sense resistance $R_S$ interposed between the sense electrode S provided in the IGBT element and the emitter electrode E (low potential power source wire 31). In the sense electrode S, a feeble current proportional to the collector current, that is, a sense current flows. This sense current flows in the sense resistance $R_S$. Accordingly, across the sense resistance $R_S$, a voltage proportional to the sense current, or a voltage proportional to the collector current is generated. The sensing circuit Se outputs this voltage as sensing signal $S_{SE}$.

In the temperature detecting circuit OT, a series circuit connecting a zener diode SA and a diode Di in series is interposed between the collector electrode C and gate electrode G of the IGBT element. That is, the anode electrode of the zener diode SA and the anode electrode of the diode Di are connected to each other, and the cathode of the zener diode SA is connected to the collector electrode of the IGBT element, and the cathode electrode of the diode Di is connected to the gate electrode G of the IGBT element.

Between the gate electrode G and emitter electrode E, a transistor Q is interposed. That is, the collector electrode of the transistor Q is connected to the gate electrode G of the IGBT element, and its emitter electrode is connected to the emitter electrode E of the IGBT element. The base electrode of transistor Q is connected to the junction of the zener diode SA and diode Di. This junction is also connected to the diagnosis circuit PC outside the overvoltage detecting circuit OV through resistance $R_{OV}$. That is, the potential of this junction is put into the diagnosis circuit PC as detection signal $S_{OV}$.

When the collector-emitter voltage of the IGBT element exceeds the sum value of the zener voltage of the zener diode SA, forward voltage of the diode Di, and base-emitter voltage of the transistor Q, the transistor Q conducts to lower the gate-emitter voltage, so that the IGBT element makes transition from conductive state to shutdown state. At the same time, the collector-emitter voltage of the IGBT element is clamped so as not to exceeds this sum value.

In this way, the overvoltage detecting circuit OV sends out the detection signal $S_{ov}$ to the diagnosis circuit PC, and functions not only to protect the IGBT element indirectly through the diagnosis circuit PC, but also to prevent directly excessive elevation of the collector-emitter voltage. It is noted that the shutdown of the IGBT element given by the transistor Q is only transitional, whereas finally it is cut off sufficiently by the function of the shutdown circuit SD.

The temperature detecting circuit OT comprises a reference voltage generating element 36 connected between the high potential power source wire 30 and low potential power source wire 31 for generating a specific reference voltage, and a series circuit of a thermistor TH and a resistance Rref for dividing down the reference voltage delivered by the reference voltage generating element 36. The potential at the junction of the resistance Rref and thermistor TH is put into the diagnosis circuit PC as temperature detection signal $S_{OT}$. The thermistor TH is placed at a position in the device suited to measuring the temperature of the copper base plate, and the resistance value varies depending on temperature changes. Therefore, the temperature detecting signal $S_{OT}$ is a value eventually reflecting the temperature of the copper base plate.

<1.3 Constitution of diagnosis circuit PC>

Figure 4:
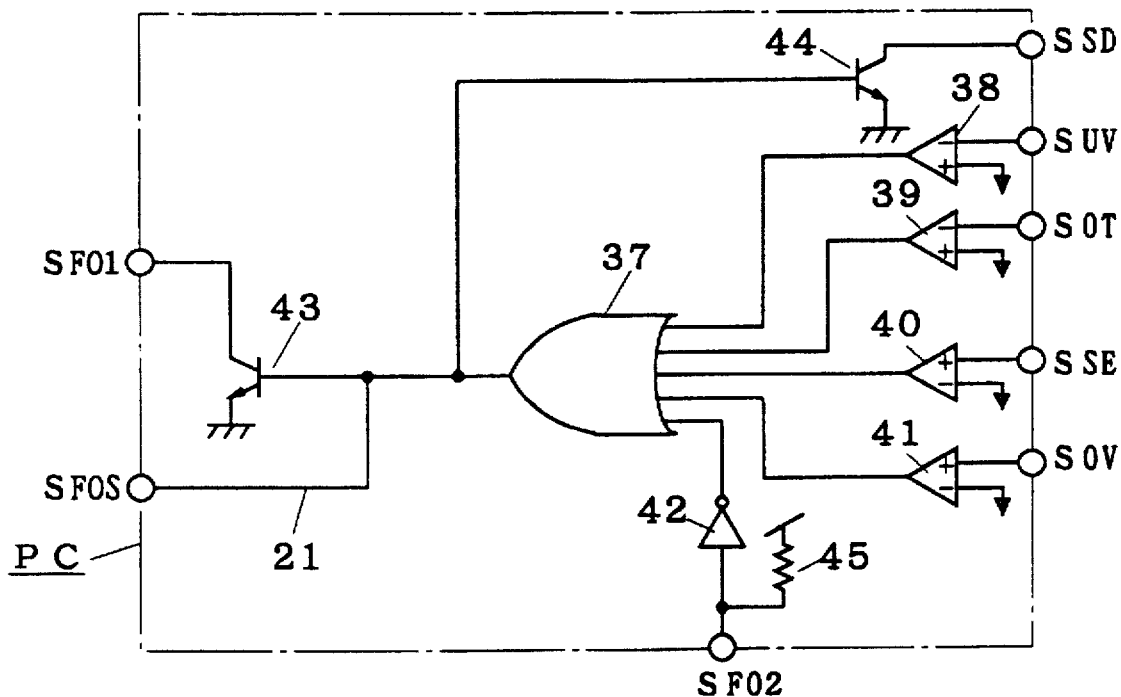
FIG. 4 is a circuit diagram showing a constitution of a diagnosis circuit in the device in FIG. 1.

FIG. 4 is a circuit diagram showing an internal constitution of the diagnosis circuit PC. The diagnosis circuit PC comprises a multi-input OR circuit 37. Comparators 38, 39, 40, 41, and inverter 42 are connected to the input terminal of the OR circuit 37, and transistors 43, 44, and signal wire 21 are connected to its output terminal.

The comparator 38 compares the detection signal $S_{UV}$ from the undervoltage detecting circuit UV with a specified reference voltage, and outputs a signal of high level corresponding to occurrence of abnormality when the detection signal $S_{UV}$ becomes lower than the reference value. The reference voltage of the comparator 38 is set so that the detection signal $S_{UV}$ may be lower than the reference voltage in response when the supply voltage $V_D$ becomes lower than the allowable value.

The comparator 39 compares the temperature detection signal $S_{OT}$ from the temperature detecting circuit OT with a specified reference voltage, and outputs a signal of high level when the temperature detection signal $S_{OT}$ becomes lower than the reference value. The reference voltage of the comparator 39 is set so that the temperature detection signal $S_{OT}$ may exceed the reference voltage in response when the temperature of the copper base plate exceeds the allowable value.

The comparator 40 compares the sensing signal $S_{SE}$ from the sensing circuit Se with a specified reference voltage, and outputs a signal of high level when the sensing signal $S_{SE}$ exceeds the reference value. The reference voltage of the comparator 40 is set so that the sensing signal $S_{SE}$ may exceed the reference voltage in response when the collector current of the IGBT element exceeds the allowable value.

The comparator 41 compares the detection signal $S_{OV}$ from the overvoltage detecting circuit OV with a specified reference voltage, and outputs a signal of high level when the detection signal $S_{OV}$ exceeds the reference value. The reference voltage of the comparator 41 is set so that the detection signal $S_{OV}$ may exceed the reference voltage in response when the collector-emitter voltage of the IGBT element exceeds the allowable value.

To the input terminal of the OR circuit 37, in addition to the output signals of the comparators 38 to 41, an abnormality detection signal $S_{FO2}$ from the diagnosis circuit PC belonging to other module (for example, 10b) is entered through an inverter 42. Therefore, when any one of the four detection signals becomes a value corresponding to occurrence of abnormality, or when the diagnosis circuit PC belonging to other module (for example, 10b) outputs an abnormality detection signal $S_{FO2}$, the OR circuit 37 outputs a signal of high level. This output signal of high level corresponds to the judging result "Abnormality has occurred in device 201."

The output signal of the OR circuit 37 is sent out to the input and output interface I/O as notice signal $S_{FOS}$ through the signal wire 21, and is sent out to the diagnosis circuit PC belonging to other module as abnormality detection signal $S_{FO1}$ through a transistor 43, and further sent out to the shutdown circuit SD as shutdown signal $S_{SD}$ through a transistor 44.

To the input terminal of the inverter 42, a pull-up resistance 45 is connected. It is because this input terminal is coupled with the transistor 43 that is put in open collector state of the diagnosis circuit PC belonging to other module. Although not shown, the diagnosis circuit PC comprises a circuit for generating a specific reference voltage for each one of the comparators 38 to 41. As this circuit for generating reference voltage, a well-known conventional element can be used.

<1.4 Constitution of input and output interface I/O>

Figure 5:
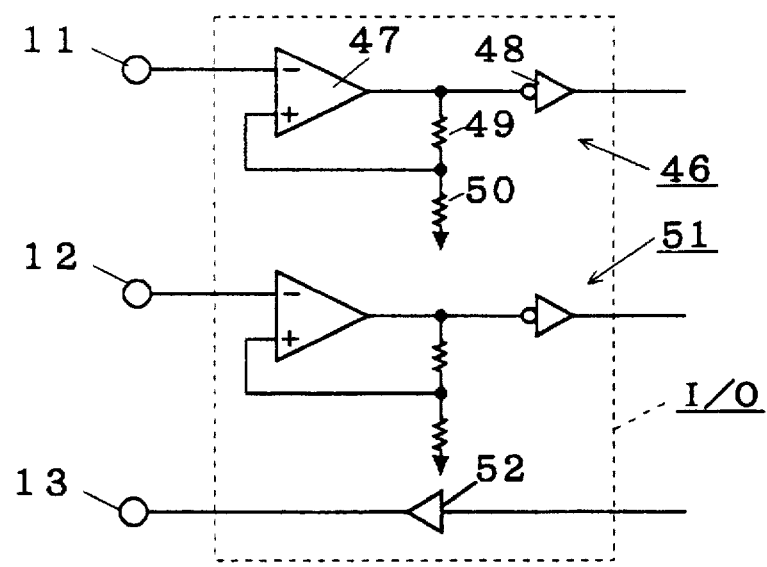
FIG. 5 is a circuit diagram showing a constitution of an input and output interface in the device in FIG. 1.

FIG. 5 is a circuit diagram showing an internal constitution of the input and output interface I/O. The input and output interface I/O comprises a relay circuit 46 for relaying the input signal from the terminal 11 to the logic circuit L, and a relay circuit 51 for relaying the input signal from the terminal 12 into the logic circuit L. The relay circuit 46 is furnished with an inverting amplifier 47 having a same backlash characteristic as a Schmitt trigger as being connected with resistances 49, 50, and an inverter 48 connected to its output. The other relay circuit 51 is constituted same as the relay circuit 48. These relay circuits 46 and 51 play the role of converting the input signals into a signal format suited to the logic circuit L.

The input and output interface I/O further comprises a buffer 52 for relaying the notice signal $S_{FOS}$ sent out from the diagnosis circuit PC into the I/F 106b.

<1.5 Constitution of logic circuit L>

Figure 6:
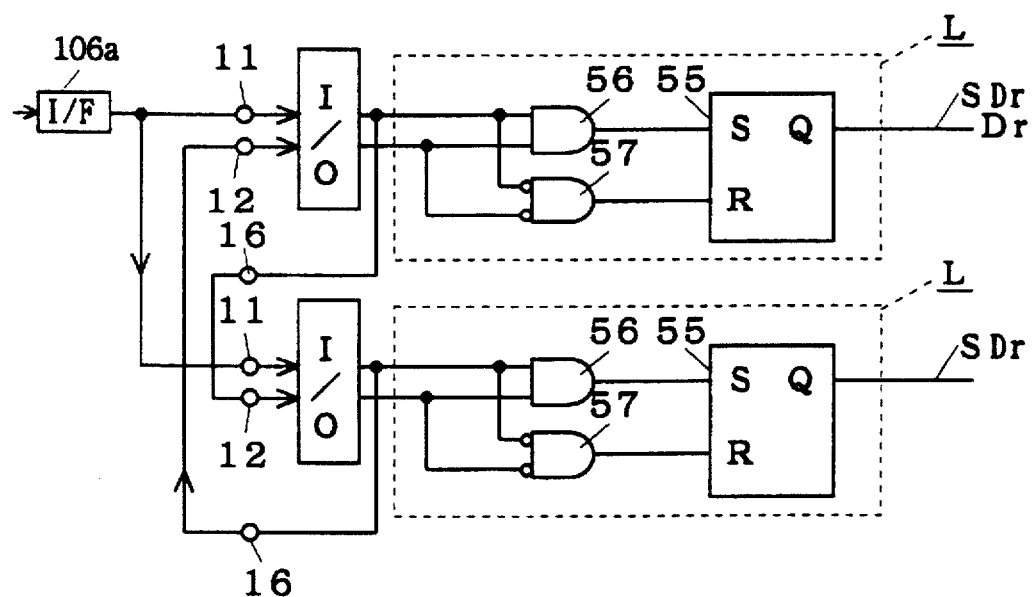
FIG. 6 is a circuit diagram showing a constitution of a logic circuit in the device in FIG. 1.

FIG. 6 is a block diagram showing the input and output interface I/O and logic circuit L belonging to the modules 10a, 10b, and wiring for connecting between them. The internal constitution of the logic circuit L is shown in a circuit diagram.

The logic circuit L comprises an SR latch 55, a two-input AND circuit 56, and a two-input NOR circuit 57. To the S terminal (set terminal) of the SR latch 55, the output of the AND circuit 56 is applied, and to the R terminal (reset terminal), the output of the NOR circuit 57 is applied. Moreover, to one of the two inputs of each of the AND circuit 56 and NOR circuit 57, an input signal from the I/F 106a is inputted through the terminal 11 and input and output interface I/O, and to the other one of the two inputs, the output of the input and output interface I/O belonging to the other module is inputted through the terminal 12 and input and output interface I/O.

Therefore, the Q terminal output of the SR latch 55 rises in synchronism with the signal which is late to rise to high level among the input signal through the terminal 11 and the input signal through the terminal 12, and falls in synchronism with a signal which is late to fall to low level. This Q terminal output is sent out to the drive circuit Dr as drive signal $S_{Dr}$. That is, the logic circuit L outputs the later input signal of the two input signals as drive signal $S_{Dr}$.

<1.6 Action example of device>

Figure 7:
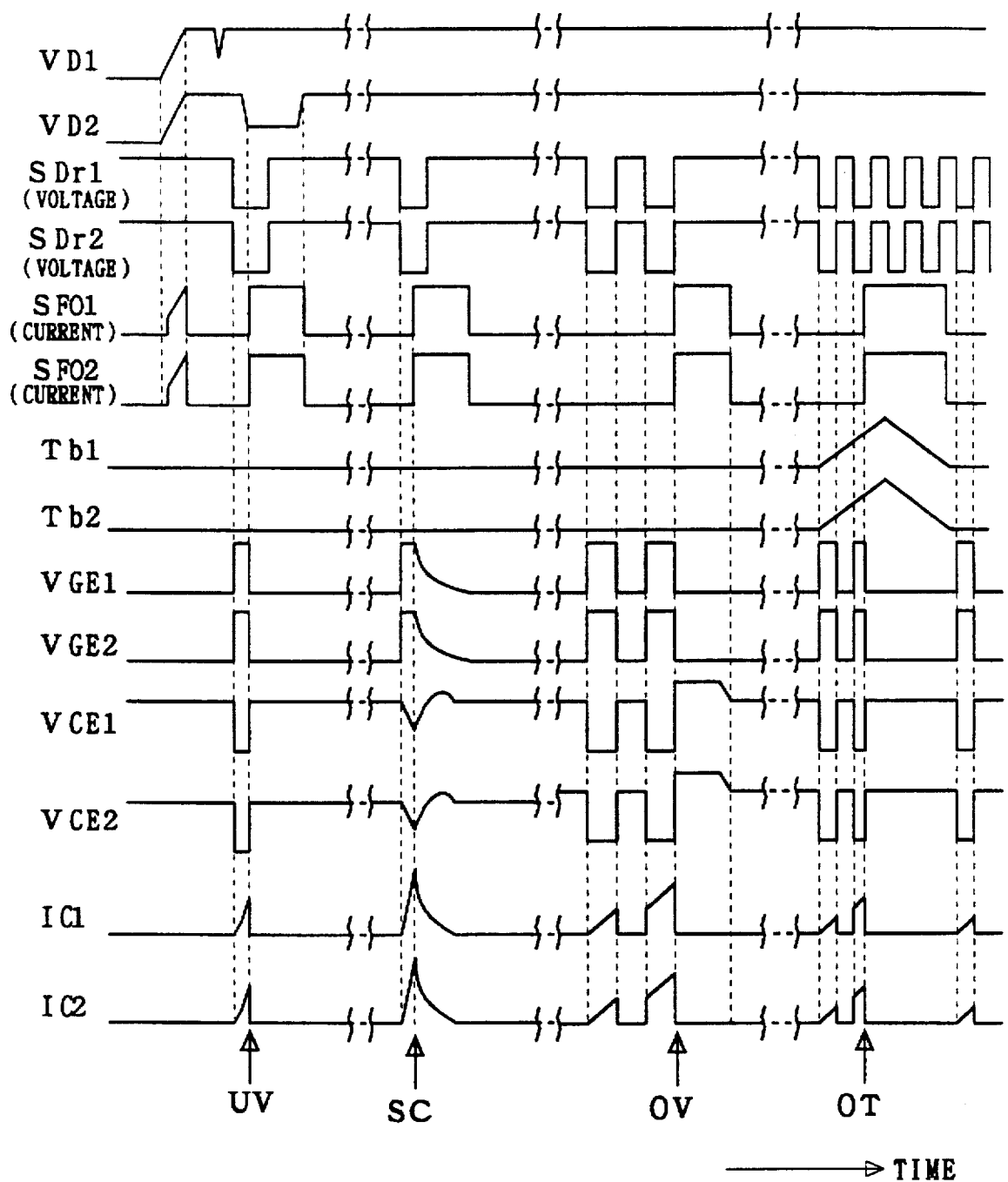
FIG. 7 is a timing chart showing an action example of the device in FIG. 1.
Figure 29:
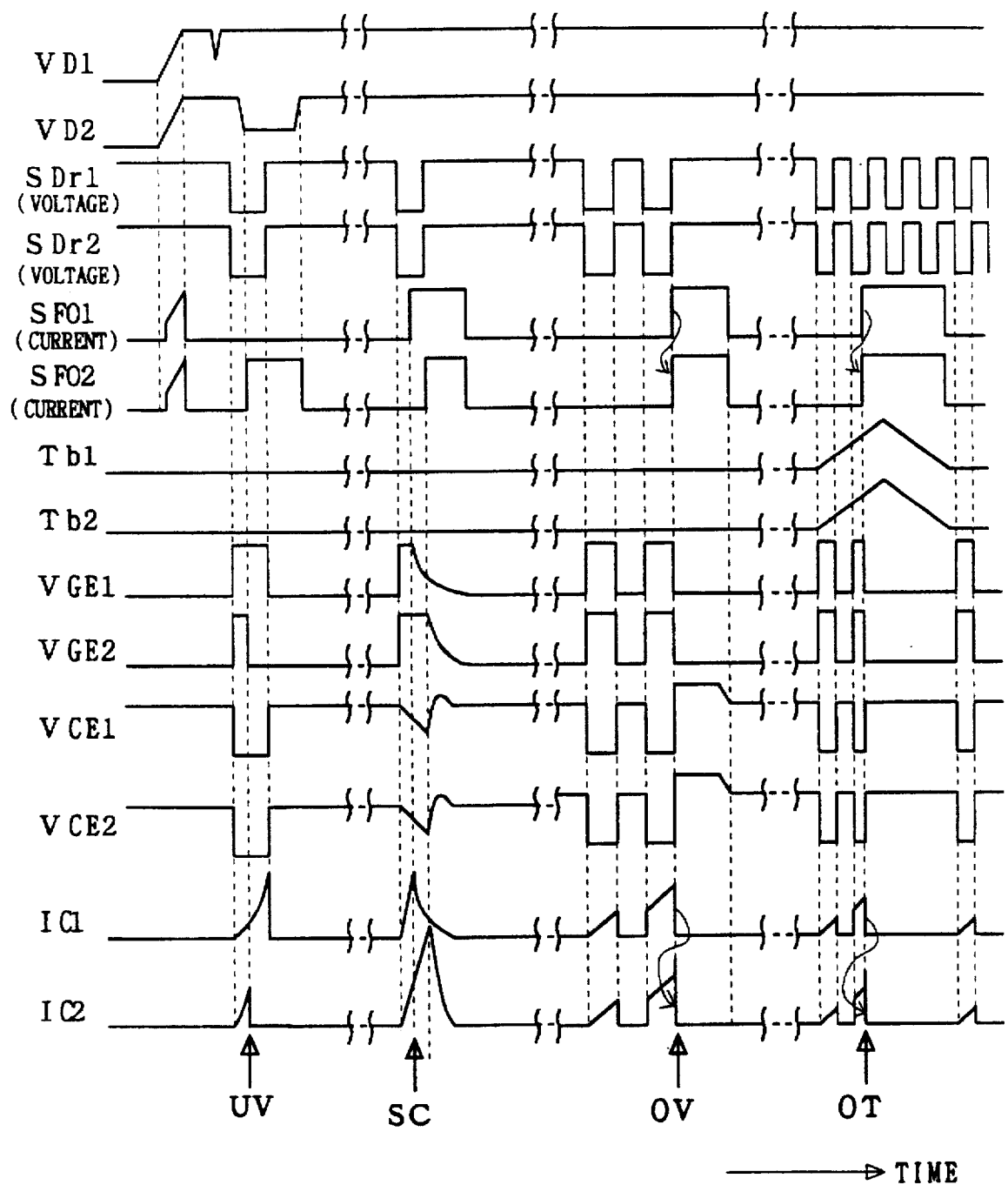
FIG. 29 is a timing chart showing an action example of the device in FIG. 28.
Figure 30:
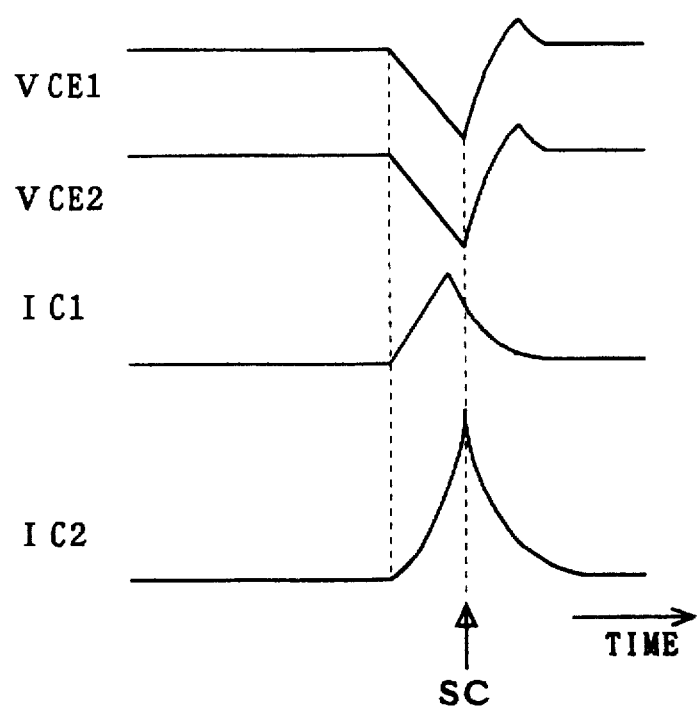
FIG. 30 is a timing chart magnifying part of FIG. 29.

FIG. 7 is a timing chart showing an action example of the device 201. Relating to two modules 10a, 10b, FIG. 7 depicts waveforms of supply voltages $V_D1$, $V_D2$, drive signals $S_{Dr}1$, $S_{Dr}2$, and abnormality detection signals $S_{FO1}$, $S_{FO2}$ of drive circuit Dr and others, temperatures Tb1, Tb2 of copper base plates detected by the temperature detecting circuit OT, gate-emitter voltages VGE1, VGE2 of IGBT element, collector-emitter voltages VCE1, VCE2 of IGBT element, and collector currents IC1, IC2 of IGBT element. In FIG. 7, moreover, voltage waveforms are drawn for drive signals $S_{Dr}1$, $S_{Dr}2$, and current waveforms are drawn for abnormality detection signals $S_{FO1}$, $S_{FO2}$ That is, FIG. 7 is drawn so as to be compared with FIG. 29 showing an action example of the conventional device.

As shown in FIG. 7, when the power source is turned on in the device 201, supply voltages $V_D1$, $V_D2$ begin to rise. When the supply voltages $V_D1$, $V_D2$ reach a certain level, the undervoltage detecting circuit UV is ready to work. At this time, the undervoltage detecting circuit UV detects that the supply voltages $V_D1$, $V_D2$ are below the allowable value, and sends a detection signal to the diagnosis circuit PC. The diagnosis circuit PC, on the basis of this detection signal, detects occurrence of abnormality, and outputs abnormality detection signals $S_{FO1}$, $S_{FO2}$.

When the supply voltages $V_D1$, $V_D2$ reach the normal value, the undervoltage detecting circuit UV stops transmission of detection signal. As a result, the diagnosis circuit PC stops transmission of abnormality detection signals $S_{FO1}$, $S_{FO2}$. FIG. 7 depicts the process of rise and recovery of abnormality detection signals $S_{FO1}$, $S_{FO2}$ in the course of rise of supply voltages $V_D1$ $V_D2$. In this device 201, since the abnormality detection signals $S_{FO1}$, $S_{FO2}$ outputted by the diagnosis circuit PC are put into other diagnosis circuit PC, the abnormality detection signals $S_{FO1}$, $S_{FO2}$ are recovered at the same time. That is, in the device 201, it is advantageous that both of parallel connected modules 10a, 10b transfer to the ready state at the same time.

In the period of normal action of the device 201, when drive signals $S_{Dr}1$, $S_{Dr}2$ are at low level corresponding to active level, the gate-emitter voltage VGE1, VGE2 becomes high level, and the IGBT element conducts, and hence the collector currents IC1, IC2 increase. To the contrary, when the drive signals $S_{Dr}1$, DSr2 are at high level corresponding to normal level, the gate-emitter voltages VGE1, VGE2 are at low level, and the IGBT element shuts down, and hence the collector currents IC1, IC2 are pulled back to zero.

In this normal action, since the drive signals $S_{Dr}1$, $S_{Dr}2$ are changed at the same time by the function of the logic circuit L, the moments of changing in the gate-emitter voltages VGE1, VGE2 are also the same. Therefore, in normal action, the IGBT elements belonging to the modules 10a, 10b conduct and shut down at the same time. Accordingly, in the device 201, the problem of concentration of load in a certain IGBT element in normal action period seen in the conventional device can be eliminated.

After transferring to normal action, if the supply voltage $V_D1$ drops for a very shot time width not interfering the operation of the drive circuit Dr and others, the undervoltage detecting circuit UV does not send out detection signal, and the device 201 keeps normal action. On the other hand, in the period indicated by UV in FIG. 7, if the supply voltage $V_D2$ drops for a time width not allowable in operation for the drive circuit Dr and others, this abnormality is detected by the undervoltage detecting circuit UV of the module 10b.

As a result, the diagnosis circuit PC of the module 10b sends out a shutdown signal $S_{SD}$ to the shutdown circuit SD. At the same time, the diagnosis circuit PC sends out an abnormality detection signal $S_{FO2}$ to the diagnosis circuit PC of the module 10a. Consequently, the diagnosis circuit PC belonging to the module 10a receives this abnormality detection signal $S_{FO2}$, and sends out a shutdown signal $S_{SD}$. That is, the shutdown signal $S_{SD}$ is sent out simultaneously between the modules 10a and 10b.

In the example shown in FIG. 7, in the period before and after time UV, the drive signals $S_{Dr}1$, $S_{Dr}2$ are at low level corresponding to active level. Accordingly, at least until the shutdown circuit SD operates, the IGBT elements of the both modules 10a, 10b are in conductive state, and the collector currents IC1, IC2 are in an ascending process.

Afterwards, the shutdown circuits SD of both modules 10a, 10b operate simultaneously in response to shutdown signal $S_{SD}$, the IGBT elements of both modules shut down simultaneously, and the collector currents IC1, IC2 decrease toward zero. At this time, the IGBT elements of both modules shut down simultaneously, and hence the collector current of one IGBT element does not increase excessively. That is, the load is not concentrated in a certain IGBT element.

In the event of an abnormality of short-circuiting of load, suppose the drive signals $S_{Dr}1$, $S_{Dr}2$ become low level and that the IGBT elements of both modules 10a, 10b conduct. Accordingly, in both modules 10a, 10b, the collector current of the IGBT elements elevates excessively. As a result, in both modules 10a, 10b, the diagnosis circuit PC detects occurrence of abnormality on the basis of sensing signal $S_{SE}$ from the sensing circuit Se (the time indicated by SC in FIG. 7).

As a result, by the function of the shutdown circuit SD, the IGBT elements of the modules 10a, 10b are cut off. Even if there is deviation between the two modules 10a, 10b in the moment of the sensing signal $S_{SE}$ exceeding a specified reference voltage, since the diagnosis circuits of the modules 10a, 10b are mutually coupled in the sense mentioned above, the both diagnosis circuits PC send out the shutdown signal $S_{SD}$, in synchronism with one of the sensing signals $S_{SE}$ exceeding the reference value at the earliest moment. Hence, the IGBT elements of the modules 10a, 10b are cut off at the same time.

Figure 8:
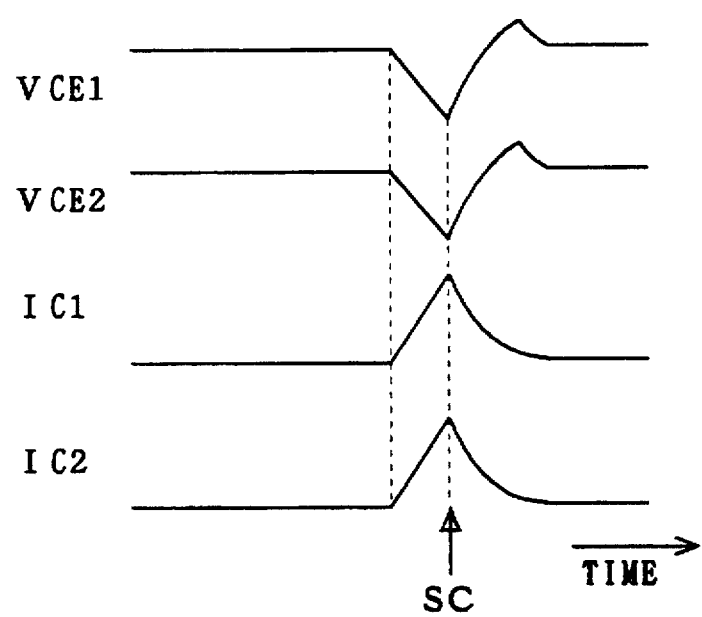
FIG. 8 is a timing chart magnifying part of FIG. 7.

FIG. 8 is a timing chart, magnifying the waveforms of collector-emitter voltages $V_{CE1}$, $V_{CE2}$ and collector currents $I_{C1}$, $I_{C2}$ in the period before and after time SC. As shown in FIG. 8, since the IGBT elements belonging to the modules 10a, 10b are cut off simultaneously, the both collector currents $I_{C1}$, $I_{C2}$ are simultaneously turned to a decreasing direction. Hence, the load is not concentrated in the IGBT element of one module.

Back to FIG. 7, when the IGBT element turns from conduction to shutdown, an excessive voltage may be applied between the collector electrode and emitter electrode (the time indicated by OV). On the basis of the detection signal $S_{OV}$ sent out by the overvoltage detecting circuit OV of the modules 10a, 10b, the diagnosis circuits PC detect occurrence of overvoltage. If there is deviation between the two modules 10a, 10b in the moment of the detection signal $S_{OV}$ exceeding a specified reference voltage, the both diagnosis circuits PC send out the shutdown signal $S_{SD}$ in synchronism with one of the detection circuits $S_{OV}$ exceeding the reference voltage at the earliest period, so that the IGBT elements of the modules 10a, 10b are cut off simultaneously. Therefore, concentration of load in the IGBT element belonging to one module is avoided.

During normal action, if the temperature of the copper base plate rises to an abnormal height, on the basis of the temperature detection signal sent out by the temperature detecting circuit OT, the diagnosis circuit PC detects occurrence of abnormality (the time indicated by OT). As shown in FIG. 7, supposing the IGBT elements of the modules 10a, 10b to be in conductive state just before this time OT, these IGBT elements change from conductive state to shutdown state by the function of the diagnosis circuit PC and shutdown circuit SD. Thus, the IGBT elements and others are protective from abnormal temperature rises.

Even if there is a deviation between the two modules 10a, 10b in the timing of the temperature detection signal $S_{OT}$ becoming lower than a specified reference voltage, since the both diagnosis circuits PC send out the shutdown signal $S_{SD}$ in synchronism with one of the detection signals $S_{OV}$ becoming lower than the reference voltage at the earliest timing, the IGBT elements of the modules 10a, 10b are cut off simultaneously. Therefore, concentration of load in the IGBT element of one module is avoided.

As described herein, in the compound power module 201, the IGBT elements act always in coincidence in timing, whether in normal action or in abnormal state, between the semiconductor power modules 10a, 10b connected parallel. It hence eliminates the problem of concentration of load in the IGBT element of either module as seen in the conventional device.

Moreover, in the device 201, since the modules 10a, 10b connected parallel to each other have identical constitution, only one type of module is enough. Hence, in the device 201, the manufacturing cost is kept low.

<2. Preferred embodiment 2>

Preferred embodiment 1 relates to an example of compound power module composed by connecting two semiconductor power modules parallel to each other, and this compound power module can be extended to a compound power module connecting parallel three or more semiconductor power modules. An extended compound power module is described herein.

Figure 9:
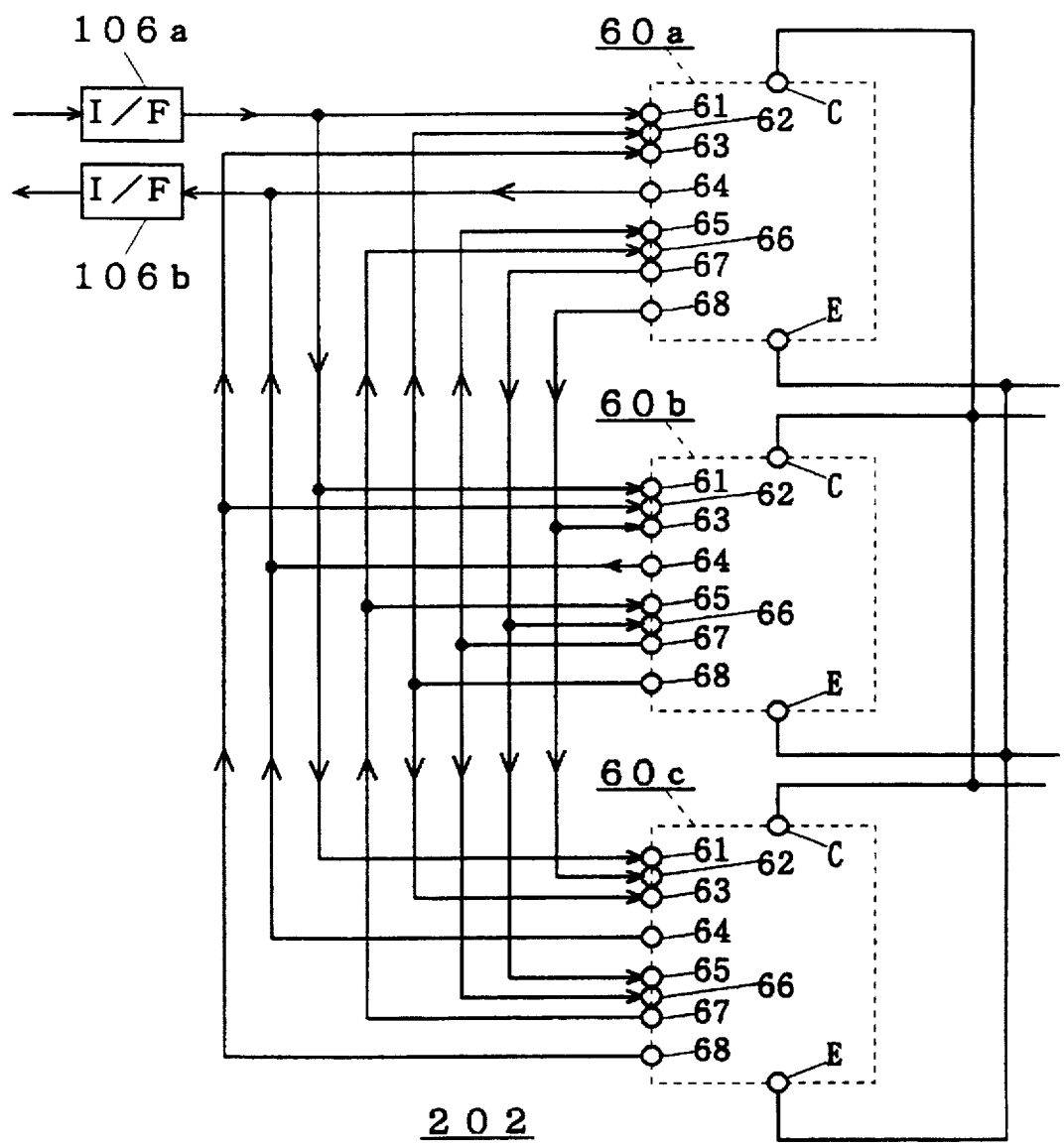
FIG. 9 is a block diagram showing a constitution of a device in preferred embodiment 2 of the present invention.

FIG. 9 is a block diagram showing a general constitution of a compound power module in this preferred embodiment. This compound power module 202 comprises three semiconductor power modules 60a, 60b, 60c connected parallel to each other. These modules 60a, 60b, 60c mutually have same constitution. As a representative example, the internal structure of the module 60a is shown in a block diagram in FIG. 10.

In the module 60a (60b, 60c), its input and output interface I/O relays three input signals entered from three terminals 61,62, 63 to the logic circuit L, and two abnormality detection signals $S_{F02}$, SF03 are put into the diagnosis circuit PC through two terminals 65, 66, which is characteristically different from the module 10a (10b) for composing the device 201.

The output signal wire of the I/F 106a is branched off, and connected to the input and output interface I/O of the modules 60a, 60b, 60c through each terminal 61. The input signal entering from the I/F 106a is put into each input and output interface I/O through each terminal 61 of the modules 60a, 60b, 60c. This input signal passing through the input and output interface I/O is sent out to the logic circuit L, and is simultaneously sent out to the terminal 62 (or 63) of the other two modules through terminal 68.

In the input and output interface I/O, together with the input signal entered through the terminal 61, the output signal of the input and output interface I/O belonging to the other two modules connected parallel is entered through terminals 62 and 63. These three input signals are put into the logic circuit L through the input and output interface I/O.

The logic circuit L selects the latest signal among the output signals of all input and output interfaces I/O of the modules 60a, 60b, 60c connected parallel, and sends out to the drive circuit DR. Accordingly, among the three modules 60a, 60b, 60c connected parallel, there is no time deviation in conduction and shutdown actions (on, off actions) in normal state of the IGBT elements, and normal actions are done in mutual synchronism.

The diagnosis circuit PC, when an abnormality occurs, sends out a notice signal $S_{FOS}$ to an interface circuit 106b through the input and output interface I/O and terminal 64, and also sends out an abnormality detection signal $S_{F01}$ (for example, in the case of module 60a) to the diagnosis circuit PC belonging to other module connected parallel through a terminal 67. The diagnosis circuit PC receives, together with various detection signals from the undervoltage detecting circuit UV and others, abnormality detection signals $S_{F02}$, SF03 sent out by the diagnosis circuit PC belonging to other two modules connected parallel (for example, 60b, 60c) through terminals 65, 66. When either abnormality detection signal $S_{F02}$ or SF03 is received, the diagnosis circuit PC sends out a shutdown signal $S_{SD}$ to the shutdown circuit SD.

In this way, the judging result of each one of diagnosis circuits PC of the modules 60a, 60b, 60c connected parallel is fed into other diagnosis circuits PC, and when abnormality occurrence is detected in one diagnosis circuit PC, abnormality occurrence is also detected in other diagnosis circuits PC in response, and therefore the diagnosis circuits PC simultaneously send out shutdown signal $S_{SD}$ to the shutdown circuit SD. Therefore, in the event of abnormality, the IGBT elements are cut off simultaneously in all modules 60a, 60b, 60c. That is, the problem in the conventional device of concentration of load into a certain IGBT element in the event of abnormality is eliminated.

The signal wires for transmitting notice signal $S_{FOS}$ to the diagnosis circuits PC in the modules 60a, 60b, 60c are mutually converged, and connected to a single I/F 106b, and when any one of the diagnosis circuits PC sends out a notice signal $S_{FOS}$, a converted signal is sent out to the external device. That is, the external device can recognize whether all of the plural modules 60a, 60b, 60c are operating normally, or if any one of them has an abnormality.

Figure 11:
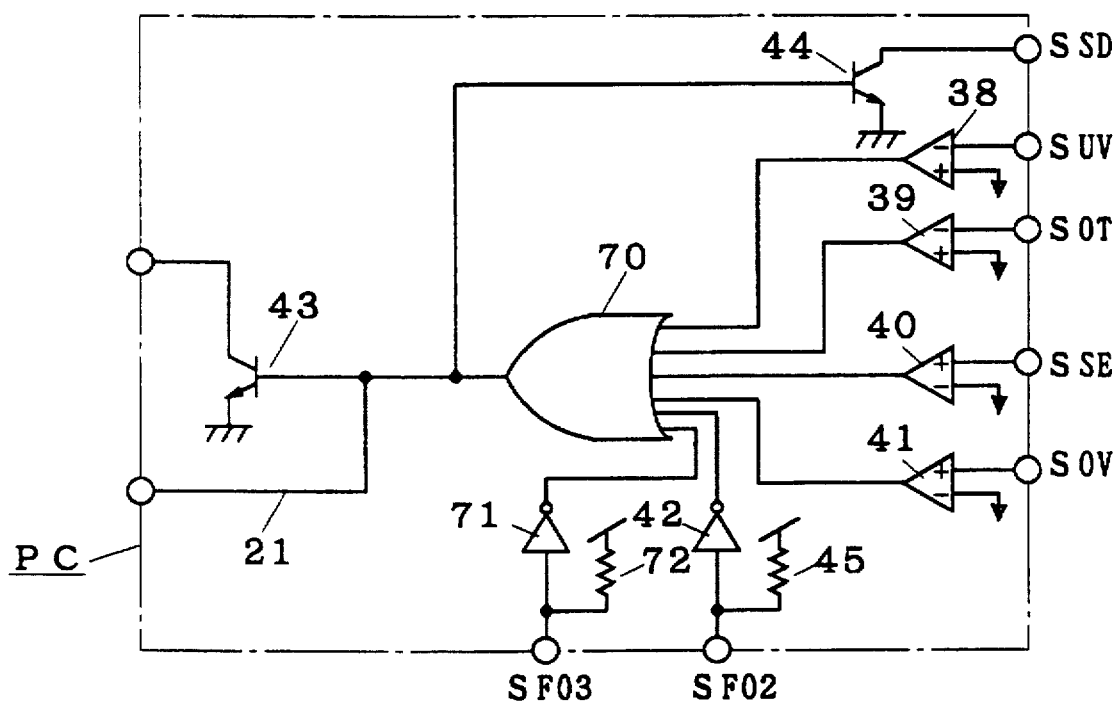
FIG. 11 is a circuit diagram showing a constitution of a diagnosis circuit in the device in FIG. 9.

FIG. 11 is a circuit diagram showing an internal constitution of the diagnosis circuit PC. The diagnosis circuit PC has a multi-input OR circuit 70. The input terminals of the OR circuit 70 are connected to comparators 38, 39, 40, 41, and inverter 42, and another inverter 71, which is different characteristically from the diagnosis circuit PC of the module 10a (10b).

The two inverters 42, 71 receive abnormality detection signals $S_{FO2}$, SF03 outputted by the diagnosis circuits PC of other modules (for example, 60b, 60c). Therefore, when any one of the four kinds of detection signals becomes a value corresponding to abnormality occurrence, or the diagnosis circuit PC belonging to any one of the other modules (for example, 60b, 60c) outputs an abnormality detection signal $S_{FO2}$ or SF03, the OR circuit 70 outputs a signal of high level. This output signal of high level corresponds to the judging result "Abnormality has occurred in the device 202."

The output signal of the OR circuit 70 is sent out to the input and output interface I/O as notice signal $S_{FOS}$ through the signal wire 21, same as in the diagnosis circuit PC shown in FIG. 4, and is further sent out to the diagnosis circuit PC belonging to the other two modules as abnormality detection signal $S_{FO1}$ through transistor 43, and moreover sent out to the shutdown circuit SD as shutdown signal $S_{SD}$ through transistor 44.

To the input terminal of the inverter 71, same as the input terminal of the inverter 42, a pull-up resistance 72 is connected. Also same as the diagnosis circuit PC in FIG. 4, the diagnosis circuit PC is also provided with a circuit (not shown) for generating a specific reference voltage in each one of the comparators 38 to 41.

Figure 12:
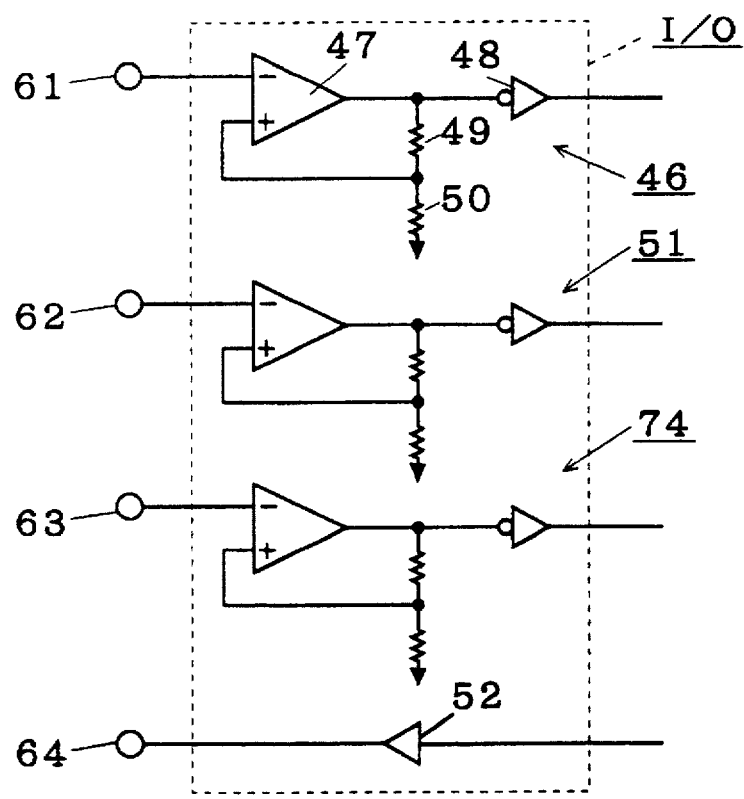
FIG. 12 is a circuit diagram showing a constitution of an input and output interface in the device in FIG. 9.

FIG. 12 is a circuit diagram showing an internal constitution of the input and output interface I/O. The input and output interface I/O is characteristically different from the input and output interface I/O shown in FIG. 5 in that it has another relay circuit 74 for relaying the input signal from a terminal 63 to the logic circuit L, aside from the relay circuits 46, 51 for relaying the input signals from terminals 61, 62 to the logic circuit L. The structure of the relay circuit 74 is same as that of the other relay circuits 46, 51.

Figure 13:
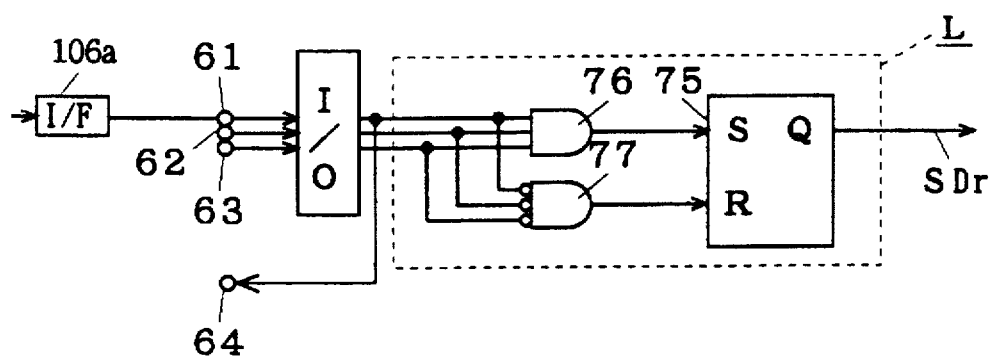
FIG. 13 is a circuit diagram showing a constitution of a logic circuit in the device in FIG. 9.

FIG. 13 is a circuit diagram showing an internal constitution of the logic circuit L belonging to the module 60a (60b, 60c). The logic circuit L comprises an SR latch 75, a three-input AND circuit 76, and a three-input NOR circuit 77. At an S terminal (set terminal) of this SR latch 75, the output of the AND circuit 76 is connected, and at an R terminal (reset terminal), the output of the NOR circuit 77 is connected.

In one of three inputs of each of the AND circuit 76 and NOR circuit 77, an input signal from the I/F 106a is fed through the terminal 61 and input and output interface I/O, and to the other two of the three inputs, the outputs of the input and output interfaces I/O belonging to the other two modules are entered through terminals 62, 63 and input and output interface I/O.

Therefore, the Q terminal output of the SR latch 75 rises in synchronism with the signal rising to the high level most lately, among the input signal through the terminal 61 and input signals through the terminals 62, 63, and falls in synchronism with the signal falling to the low level most lately. This Q terminal output is sent out to the drive circuit Dr as drive signal $S_{Dr}$. That is, the logic circuit L selects the latest input signal among three input signals, and outputs it as drive signal $S_{Dr}$.

The description herein relates to an example of a compound power module composed by parallel connection of three semiconductor power modules, and similarly a compound power module can be composed by parallel connection of four or more modules, and the problems in the conventional device can be solved similarly, as clear from the description given so far. In other words, by simply expanding the extension from the device 201 to the device 202, a compound power module can be composed by parallel connection of four or more modules.

<3. Preferred embodiment 3>

As clear from the descriptions of preferred embodiments 1 and 2, in the semiconductor power modules for composing a compound power module, applications are predetermined, such as for two-piece parallel connection, three-piece parallel connection, and so forth. Generally, however, semiconductor power modules for n-piece parallel connection can be used by parallel connection of n–1 pieces or less, including a single use. Herein, this point is described by referring to the example of semiconductor power module for three-piece parallel connection shown in FIG. 10.

Figure 10:
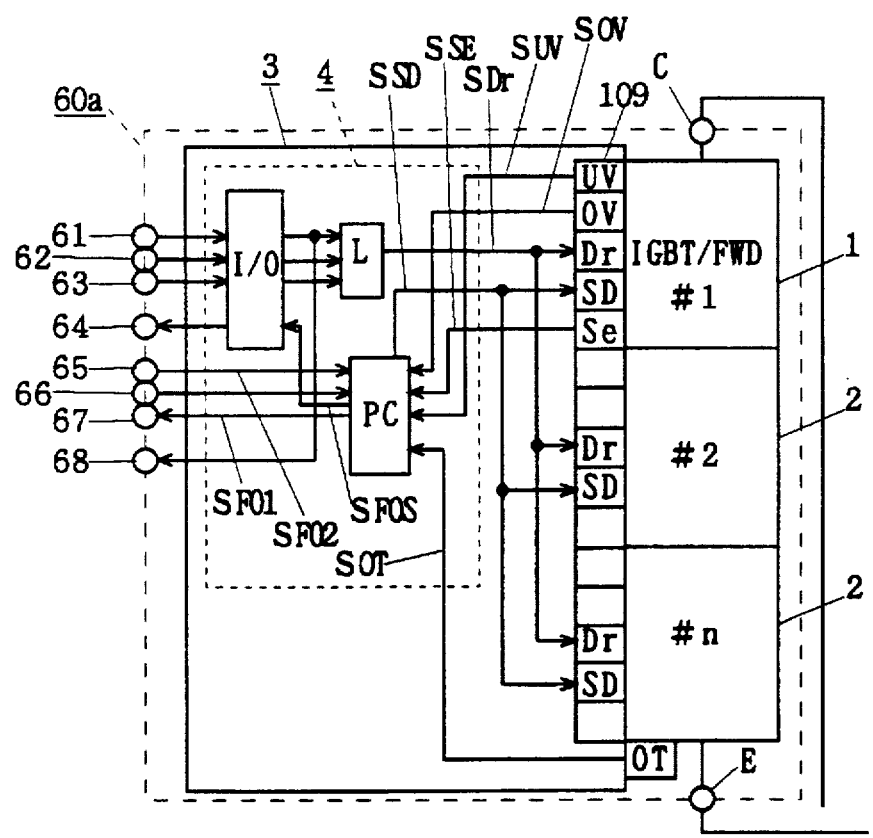
FIG. 10 is a block diagram showing a constitution of module in the device in FIG. 9.
Figure 14:
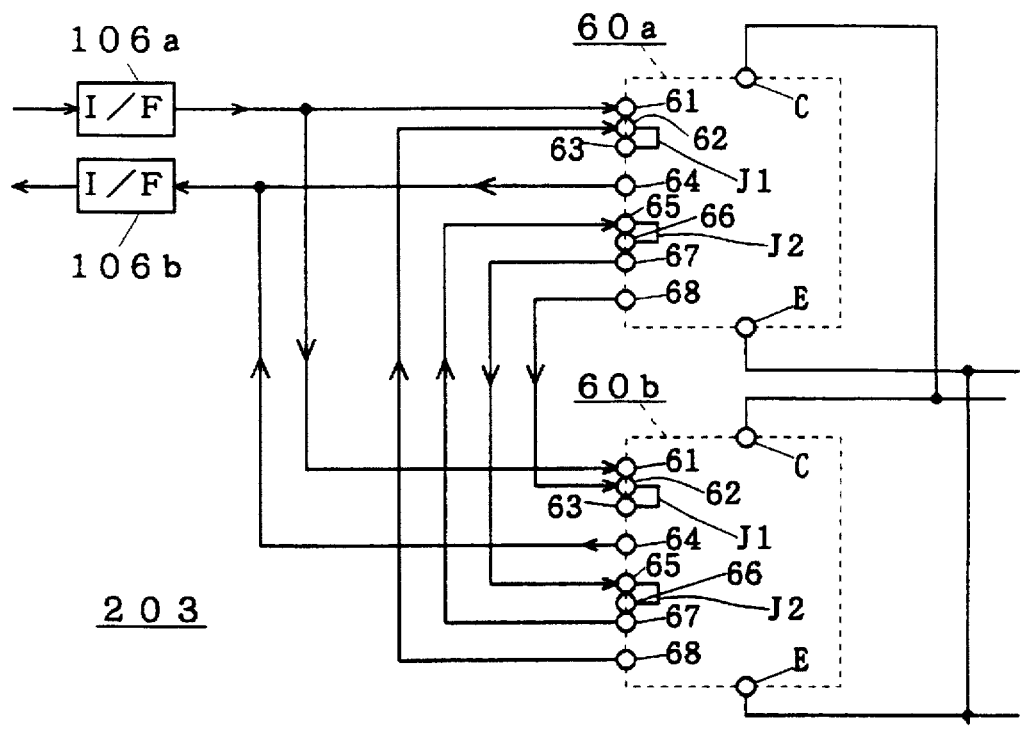
FIG. 14 is a block diagram showing a constitution of a device in preferred embodiment 3 of the present invention.

FIG. 14 is a block diagram showing a constitution of compound power module composed by parallel connection of two modules 60a, 60b (FIG. 10). In this compound power module 203, in each one of the modules 60a, 60b, terminal 62 and terminal 63 are short-circuited with jumper wire J1, and terminal 64 and terminal 65 are short-circuited with other jumper wire J2.

As easily understood from the circuit diagrams in FIG. 12 and FIG. 13, as the terminal 62 and terminal 63 are short-circuited with jumper wire J1, the input and output interface I/O and logic circuit L are equivalent to the input and output interface I/O (FIG. 5) and logic circuit L (FIG. 6) of the module 10a for two-piece parallel connection. Also as clear from the circuit diagram in FIG. 11, as the terminal 64 and terminal 65 are short-circuited with jumper wire J2, the diagnosis circuit PC is equivalent to the diagnosis circuit PC (FIG. 4) of the module 10a for two-piece parallel connection.

That is, without making any modification in the internal circuits of the modules 60a, 60b, only by processing the externally exposed terminals with jumper wires J1, J2, the modules 60a, 60b apparently become equivalent to the modules 10a, 10b shown in FIG. 1. Eventually, the terminals 61, 62 (or 63), 64 (or 65), 66, 67, 68 of the modules 60a, 60b shown in FIG. 14 are respectively equivalent to terminals 11, 12, 13, 14, 15, 16 of the modules 10a, 10b shown in FIG. 1.

Handing the terminals 61 to 68 respectively same as the corresponding terminals 11 to 16, by wiring the terminals 61 to 68 of the modules 60a, 60b, and I/F 106a, 106b, same as in the device 201 shown in FIG. 1, the device 203 shown in FIG. 14 is obtained. It is evident that the functions and characteristics of thus composed device 203 are equivalent to those of the device 201.

Incidentally, in the diagnosis circuit PC in FIG. 11, since pull-up resistances 45, 72 are connected to the input terminals of the inverters 42, 71 connected to the terminals 64, 65, the jumper wire J2 may not be used for the terminals 64, 65, and the one not used of the two may be left open.

Figure 15:
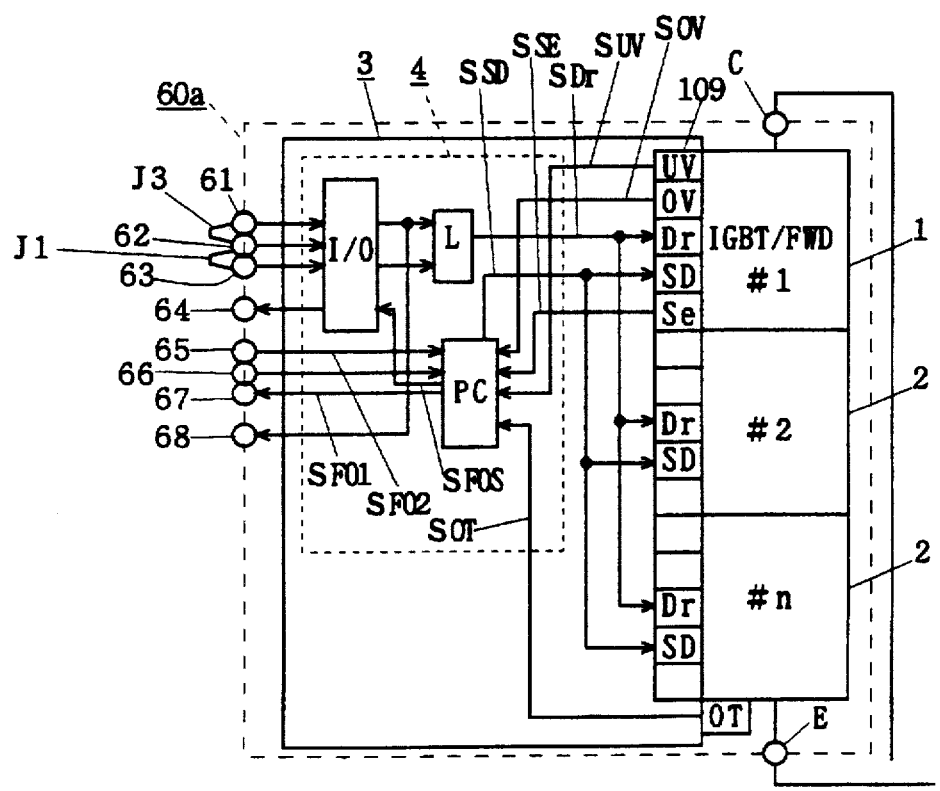
FIG. 15 is a block diagram showing mode of use of module in the device in FIG. 14.

Next is explained a mode of a single use of the module 60a for three-piece parallel connection. FIG. 15 is a wiring diagram showing the mode of this use. As shown in FIG. 15, the terminals 61, 62, 73 are short-circuited with jumper wires J1, J3. One of the short-circuited terminals is connected to an I/F 106a, and a terminal 64 is connected to an I/F 106b. The remaining terminals 65, 66, 67, 68 are not used, and are left open. To terminals 65, 66 which are input terminals, pull-up resistances 45, 72 are connected as mentioned above, and hence there is no problem if these terminals 65, 66 are left open.

The module 10a for two-piece parallel connection shown in FIG. 1 may be also used independently by processing the terminals similarly. That is, by short-circuiting the terminals 11, 12 with jumper wire, the module 10a can be used alone.

As clear from the description herein, generally, the semiconductor power modules for n-piece parallel connection can be used in parallel connection of n−1 pieces or less, including a single use. That is, only by preparing one type of semiconductor power modules for multiple parallel connection, multiple types of compound power modules differing in the number of pieces of parallel connection can be composed. Thus, the semiconductor power modules for multiple parallel connection are wide in versatility, and therefore the types of the semiconductor power modules can be restricted to one or a few for multiple parallel connection. That is, the manufacturing cost can be reduced by mass production of few variety.

<4. Preferred embodiment 4>

In the preferred embodiments described so far, the plural semiconductor power modules for composing a compound power module were identical in structure. This embodiment relates to a compound power module by parallel connection of semiconductor power modules differing in structure.

<4.1 General constitution of device>

Figure 16:
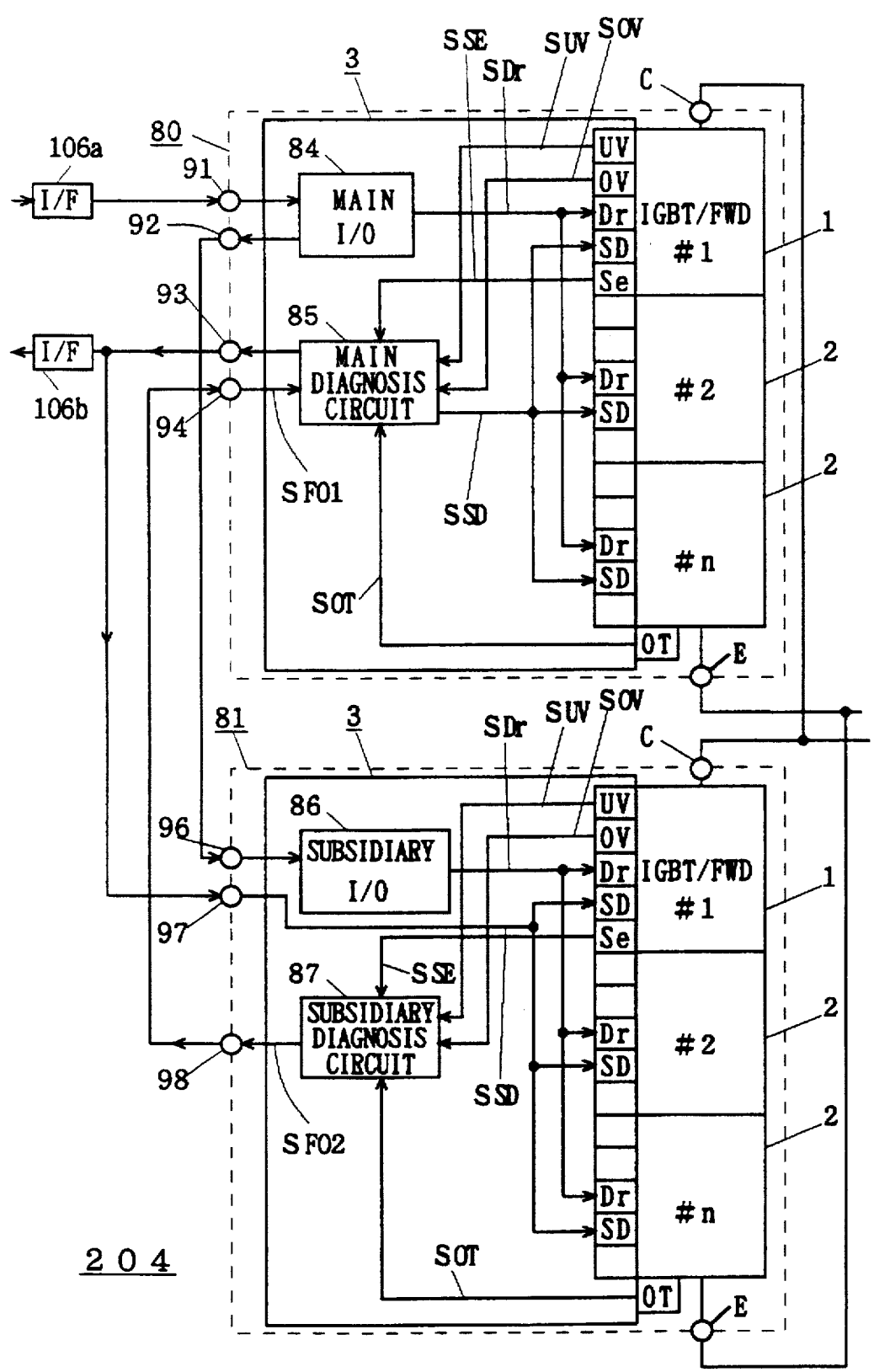
FIG. 16 is a block diagram showing a constitution of a device in preferred embodiment 4 of the present invention.

FIG. 16 is a block diagram showing a general constitution of a compound power module of this preferred embodiment. This compound module 204 comprises two semiconductor power modules 80, 81 connected parallel to each other. These modules 80, 81 are mutually different in structure, their roles are not equal, unlike the preferred embodiments 1 to 3. That is, the two modules 80, 81 are in, so to speak, master-slave relation.

One module (main module) 80 has a main interface 84, and the other module (subsidiary module) 81 has a subsidiary interface 86. The input signal sent out from the I/O 106a is fed into the main interface 84 through terminal 91 of the module 80. The main interface 84 relays this input signal, and sends out as drive signal $S_{Dr}$ to the drive circuit Dr, and simultaneously sends out to the module 81 through terminal 92. In the module 81, the signal sent out from the main interface 84 is received in the subsidiary interface 86 through terminal 96. The subsidiary interface 86 relays the received signal, and sends out as drive signal $S_{Dr}$ to the drive circuit Dr.

In this way, the signal sent out from the I/F 106a is received only in the module 80, and, through this module 80, it is secondarily fed into the other module 81. Accordingly, it alleviates the problem of timing deviation of input signal due to uneven length of wiring from the I/F 106a to each module and so on, as experienced in the conventional device, and thereby solves the problem of deviation of action of IGBT element in normal state.

Moreover, one module 80 has a main diagnosis circuit 85, and the other module 81 has a subsidiary diagnosis circuit 87. The main diagnosis circuit 85 detects occurrence of abnormality on the basis of various detection signals $S_{UV}$, $S_{OV}$, $S_{SE}$, $S_{OT}$ sent out from various detecting circuits in the module 80. When detecting occurrence of abnormality, the main diagnosis circuit 85 sends out a shutdown signal SD to the shutdown circuit SD, and sends out an abnormality detection signal $S_{FO1}$ to the I/F 106b and module 81 through terminal 93.

In the module 81, the abnormality detection signal $S_{FO1}$ sent out from the module 80 is received at terminal 97, and it is directly fed into the shutdown circuit SD. That is, the abnormality detection signal $S_{FO1}$ is used as shutdown signal $S_{SD}$ of the module 81.

The subsidiary diagnosis circuit 87 of the module 81 detects occurrence of abnormality on the basis of various detection signals $S_{UV}$, $S_{OV}$, $S_{SE}$, $S_{OT}$ sent out from various detecting circuits in the module 81. When detecting occurrence of abnormality, the subsidiary diagnosis circuit 87 sends out an abnormality detection signal $S_{FO2}$ to the module 80 through terminal 98, without sending out shutdown signal $S_{SD}$ to the shutdown circuit SD of the module 81. In the module 80, this abnormality detection signal $S_{FO2}$ is fed into the main diagnosis circuit 85 through terminal 94.

The main diagnosis circuit 85 detects occurrence of abnormality on the basis of not only the various detection signals $S_{UV}$, $S_{OV}$, $S_{SE}$, $S_{OT}$ but also the abnormality detection signal $S_{FO2}$ sent out from the subsidiary diagnosis circuit 87. That is, when receiving the abnormality detection signal $S_{FO2}$, the main diagnosis circuit 85 outputs shutdown signal $S_{SD}$ and abnormality detection signal $S_{FO1}$, regardless of the values of the various detection signals $S_{UV}$, $S_{OV}$, $S_{SE}$, $S_{OT}$.

In this way, in either module 80 or 81, when reaching a value corresponding to occurrence of abnormality in any one of detection signals $S_{UV}$, $S_{OV}$, $S_{SE}$, $S_{OT}$, the shutdown signal $S_{SD}$ is sent out in both modules 80, 81, and the individual IGBT elements are cut off. Moreover, since shutdown signal $S_{SD}$ is sent out by the single main diagnosis circuit 85, in both modules 80 and 81, deviation does not occur in the transmission timing of the shutdown signal $S_{SD}$ between the modules 80 and 81. Therefore, in the event of abnormality, the IGBT elements are cut off simultaneously in the modules 80, 81. That is, the problem in the conventional device of concentration of load in a certain IGBT element in the event of abnormality can be solved.

As mentioned above, in either module 80 or 81, when any one of the detection signals $S_{UV}$, $S_{OV}$, $S_{SE}$, $S_{OT}$ reaches a value corresponding to occurrence of abnormality, the main diagnosis circuit 85 sends out the abnormality detection signal $S_{FO1}$ to the I/F 106b. Accordingly, the external device connected to this I/F 106b can recognize whether both modules 80, 81 are working normally, or either one is abnormal.

The device 204 operates in this way, and its action may be shown in the timing chart in FIG. 7 and FIG. 8.

<4.2 Internal constitution of parts of device>

Figure 17:
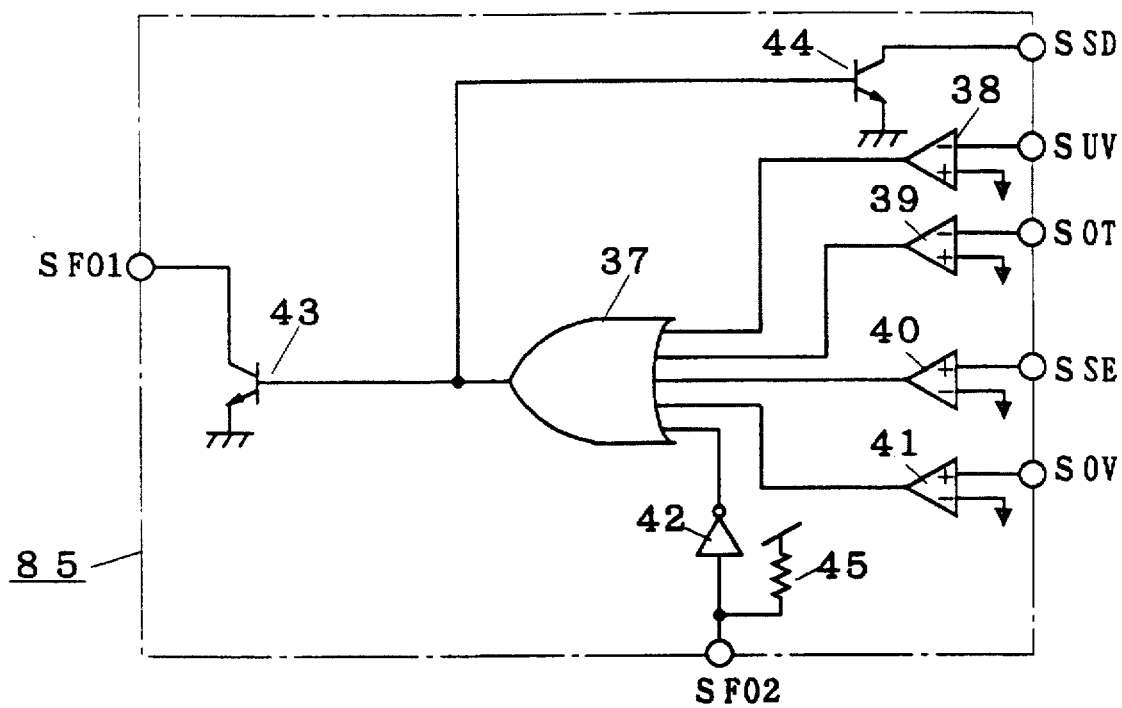
FIG. 17 is a circuit diagram showing a constitution of a main diagnosis circuit in the device in FIG. 16.

FIG. 17 is a circuit diagram showing an example of internal structure of the main diagnosis circuit 85. As clear from comparison between FIG. 17 and FIG. 4, the main diagnosis circuit 85 is identical with the diagnosis circuit PC shown in FIG. 4, except that the signal wire 21 is excluded.

Figure 18:
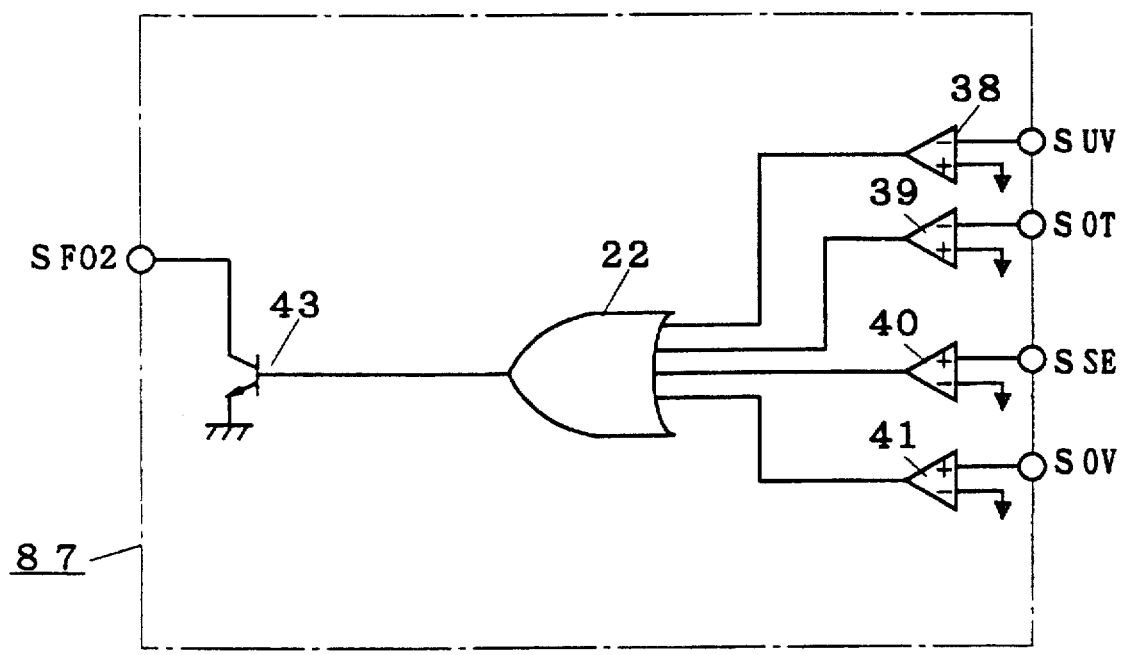
FIG. 18 is a circuit diagram showing a constitution of a subsidiary diagnosis circuit in the device in FIG. 16.

FIG. 18 is a circuit diagram showing an example of internal structure of the subsidiary diagnosis circuit 87. The subsidiary diagnosis circuit 87 possesses a multi-input OR circuit 22. As clear from comparison between FIG. 18 and FIG. 17, the subsidiary diagnosis circuit 87 is identical in constitution with the main diagnosis circuit 85, except that the OR circuit 37 is replaced by OR circuit 22, and that the inverter 42, pull-up resistance 45, and transistor 44 are excluded.

The OR circuit 22 in the subsidiary diagnosis circuit 87 outputs a signal of high level when any one of the four detection signals $S_{UV}$, $S_{OV}$, $S_{SE}$, $S_{OT}$ reaches a value corresponding to occurrence of abnormality. Therefore, the output signal of high level of the OR circuit 22 corresponds to the result "Abnormality has occurred in the module 81."

The OR circuit 37 in the main diagnosis circuit 85 outputs a signal of high level when any one of the four detection signals $S_{UV}$, $S_{OV}$, $S_{SE}$, $S_{OT}$ reaches a value corresponding to occurrence of abnormality, or when the subsidiary diagnosis circuit 87 belonging to the other module 81 outputs an abnormality detection signal $S_{F02}$. Therefore, the output signal of high level of the OR circuit 37 corresponds to the result "Abnormality has occurred in the device 204."

In either main diagnosis circuit 85 or subsidiary diagnosis circuit 87, same as in the diagnosis circuit PC in FIG. 4, there is a circuit (not shown) for generating a specific reference voltage for each one of the comparators 38 to 41.

Figure 19:
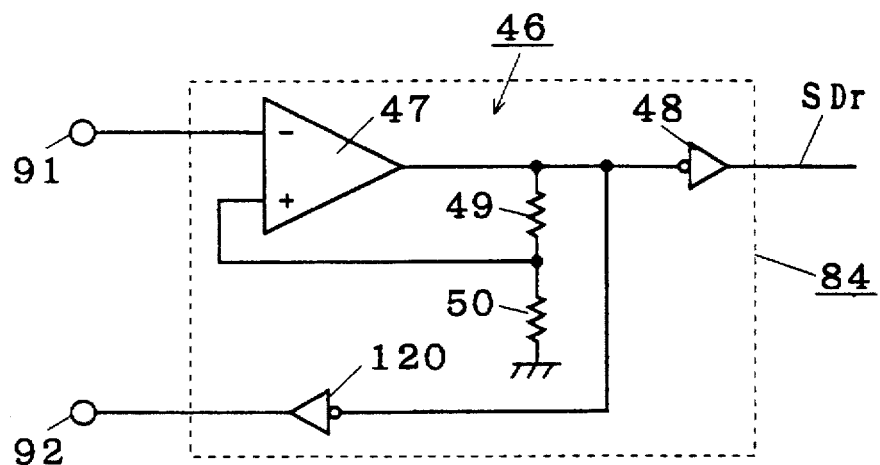
FIG. 19 is a circuit diagram showing a constitution of a main interface in the device in FIG. 16.

FIG. 19 is a circuit diagram showing an internal constitution of the main interface 84. The main interface 84, like the input and output interface I/O shown in FIG. 5, possesses a relay circuit 46 for relaying between the terminal 91 connected to the I/F 106a and the drive circuit Dr. The signal wire is branched off from the junction of an inverting amplifier 47 and an inverter 48 for composing the relay circuit 46, and this signal wire is connected to terminal 92 through other inverter 120. Accordingly, the signal entered through the terminal 91 is distributed into the drive circuit Dr and terminal 92.

Figure 20:
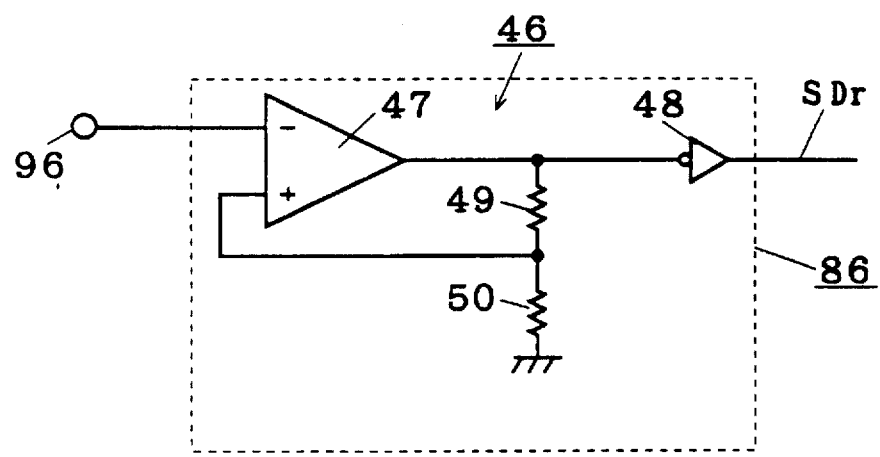
FIG. 20 is a circuit diagram showing a constitution of a subsidiary interface in the device in FIG. 16.

FIG. 20 is a circuit diagram showing an internal constitution of the subsidiary interface 86. The subsidiary interface 86, like the main interface 84, possesses a relay circuit 46 for relaying between a terminal 96 for receiving a signal from the main interface 84 and the drive circuit Dr. That is, the signal entered from the terminal 91 passes through the inverting amplifier 47 and inverter 120 of the main interface 84, and is relayed through the subsidiary interface 86, and is sent into the drive circuit Dr of the module 81.

Thus, it is an advantage of the modules 80, 81 that the structure is simple as compared with the module 10a (10b). In particular, the module 81 has a further simpler structure than the module 80. Hence, these modules 80, 81 can be manufactured at a relatively low cost.

<5. Preferred embodiment 5>

The compound power module in preferred embodiment 4 can be extended into a compound power module composed by parallel connection of three or more semiconductor power modules. Herein, an extended compound power module is described.

Figure 21:
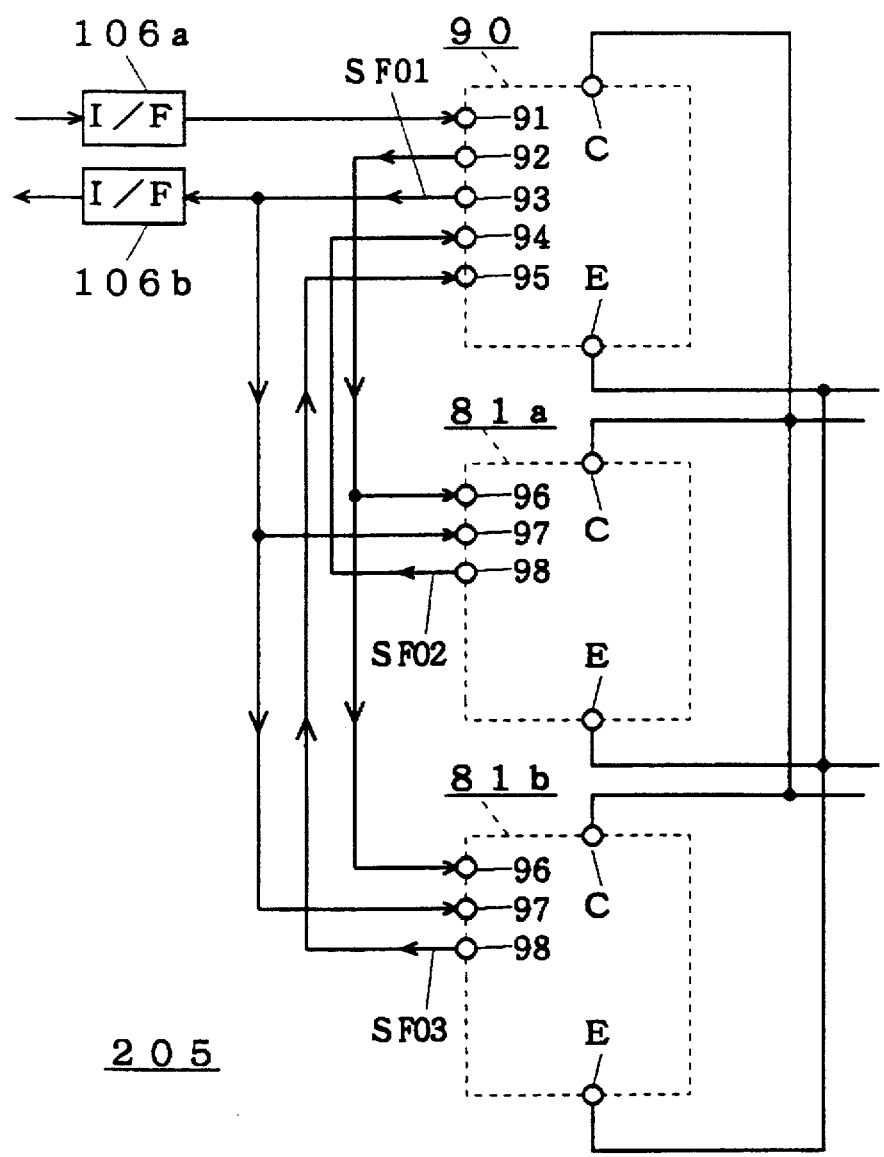
FIG. 21 is a block diagram showing a constitution of a device in preferred embodiment 5 of the present invention.
Figure 22:
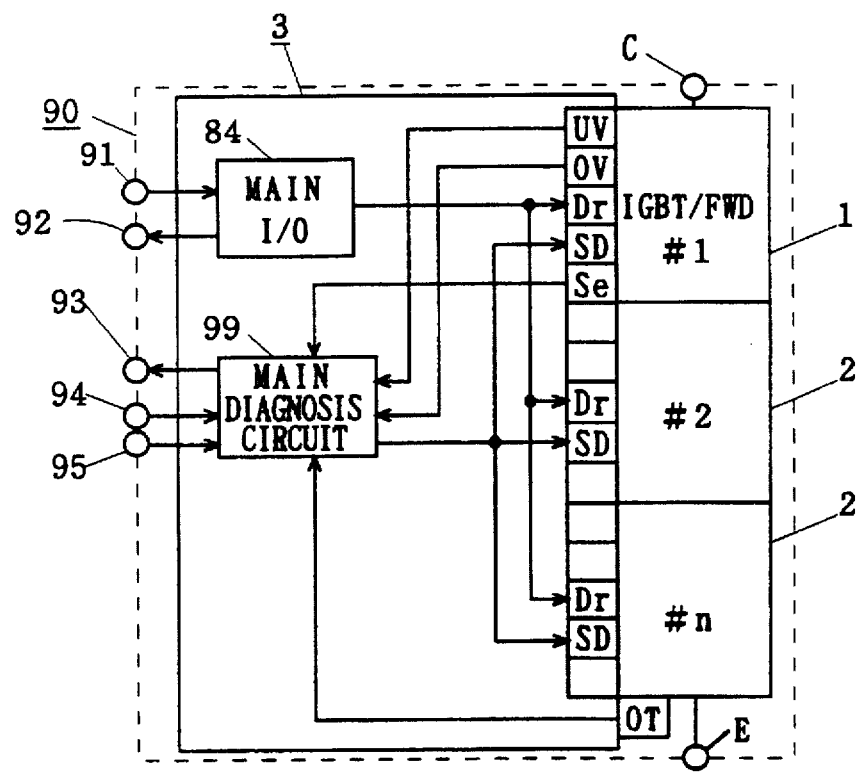
FIG. 22 is a block diagram showing a constitution of a main module in the device in FIG. 21.

FIG. 21 is a block diagram showing a general constitution of a compound power module of this preferred embodiment. This compound power module 205 comprises three semiconductor power modules 90, 81a, 81b connected parallel to each other. The modules (subsidiary modules) 81a, 81b are identical in structure, and also same as the module 81 shown in FIG. 16 in structure. An internal structure of the module (main module) 90 is shown in a block diagram in FIG. 22.

Different from the module 80 in FIG. 19, the module 90 is characteristic in that a main diagnosis circuit 99 is provided instead of the main diagnosis circuit 85. The abnormality detection signal $S_{F01}$ sent out by the main diagnosis circuit 99 in the event of abnormality is sent further through terminal 93 into I/F 106b, and both terminals 97 of the other two modules 81a, 81b. In the main diagnosis circuit 99, abnormality detection signals $S_{F02}$, SF03 sent out from subsidiary diagnosis circuits 87 of the modules 81a, 81b are entered respectively through terminals 94, 95. The main diagnosis circuit 99, when receiving either abnormality detection signal $S_{F02}$ or SF03, outputs shutdown signal Sd and abnormality detection signal $S_{F01}$.

Therefore, in any one of the modules 80, 81a, 81b, when any one of the detection signals $S_{UV}$, $S_{OV}$, $S_{SE}$, $S_{OT}$ reaches the value corresponding to occurrence of abnormality, shutdown signal $S_{SD}$ is sent out to the drive circuit Dr of all of the modules 90, 81a, 81b, and the respective IGBT elements are cut off. Moreover, since transmission of shutdown signal $S_{SD}$ in the modules 90, 81a, 81b is executed by one main diagnosis circuit 99, there is no deviation in transmission timing of shutdown signal $S_{SD}$ among the modules 90, 81a, 81b. Therefore, in the event of abnormality, the IGBT elements are cut off simultaneously in all modules 90, 81a, 81b. That is, the problem in the conventional device of concentration of load in a certain IGBT element in the event of abnormality is solved also in this device 305, same as in the device 304.

In any one of the modules 90, 81a, 81b, when any one of the detection signals $S_{UV}$, $S_{OV}$, $S_{SE}$, $S_{OT}$ reaches a value corresponding to occurrence of abnormality, the main diagnosis circuit 99 sends out an abnormality detection signal $S_{F01}$ to the I/F 106b. Accordingly, the external device connected to the I/F 106 can recognize whether all of the plural modules 90, 81a, 81b are working normally, or any one of them is abnormal.

Furthermore, the terminal 91 of the module 90 is connected to both terminals 96 of the modules 81a, 81b. Therefore, the signal sent out by the I/F 106a is once received in the module 90, and is secondarily fed into the other modules 81a, 81b. Accordingly, the problem of deviation of action of the IGBT elements in normal state can be alleviated also in this device 205, same as in the device 204.

Figure 23:
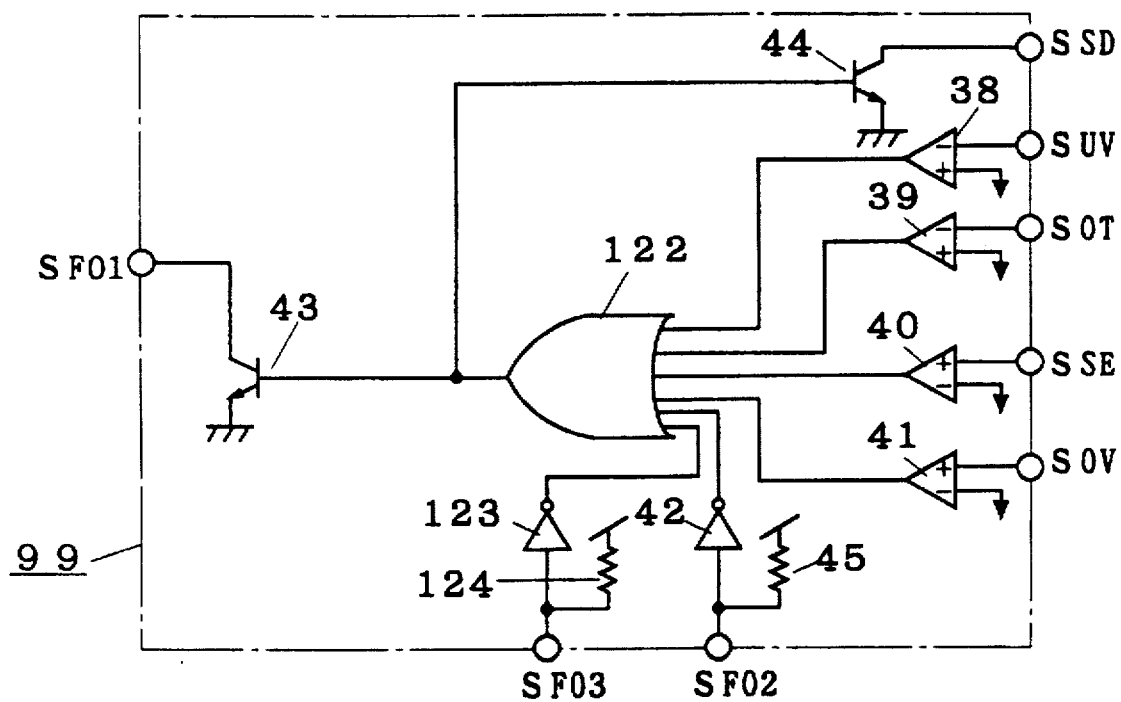
FIG. 23 is a block diagram showing a constitution of a main diagnosis circuit in the device in FIG. 21.

FIG. 23 is a circuit diagram showing an example of internal structure of the main diagnosis circuit 99. The main diagnosis circuit 99 is provided with a multi-input OR circuit 122, and the input terminal of this OR circuit 122 is connected with other inverter 123, in addition to inverter 42 and comparators 38, 39, 40, 41, which is characteristically different from the main diagnosis circuit 85 in FIG. 17. To the input terminal of the inverter 123, too, a pull-up resistance 124 is connected, same as the input terminal of the inverter 42.

The OR circuit 122 outputs a signal of high level when one of the four detection signals $S_{UV}$, $S_{OV}$, $S_{SE}$, $S_{OT}$ reaches a value corresponding to occurrence of abnormality, or the subsidiary diagnosis circuit 87 belonging to either one of the two modules 81a, 81b outputs an abnormality detection signal $S_{F02}$ or SF03. Therefore, the output signal of high level of the OR circuit 122 corresponds to the judging result "Abnormality has occurred in the device 205." Also, same as in the main diagnosis circuit 85 in FIG. 17, it has also a circuit (not shown) for generating a specific reference voltage for each one of the comparators 38 to 41.

The description herein relates to an example of a compound power module composed by parallel connection of three semiconductor power modules, and similarly a compound power module can be composed by parallel connection of four or more modules, and the problems in the conventional device can be solved as the same, as clear from the description given so far. In other words, by simply expanding the extension from the device 204 to the device 205, a compound power module can be composed by parallel connection of four or more modules.

The module to be modified when increasing the number of modules to be connected parallel is only one main module having the main interface 84, and the other modules having subsidiary interfaces 86, that is, the subsidiary module remains same as the module 81 in constitution. That is, the module 81 can be commonly used in multiple types of compound power modules. Hence, it leads to reduction of manufacturing cost.

Further, as clear from the description herein, generally, the semiconductor power modules for n-piece parallel connection can be used in parallel connection of n−1 pieces or less, including a single use. For example, the module 90 shown in FIG. 22 can be used in two-piece parallel connection only by leaving the terminal 95 open, or can be used alone only by leaving both terminals 94 and 95 open. It is therefore possible to limit the types of the main modules for multiple parallel connection. That is, the manufacturing cost can be further reduced by mass production of few variety.

<6. Preferred embodiment 6>

As described in preferred embodiment 1, the circuit block 4 for composing the module 10a (10b) is desired to be integrated in one (single) semiconductor chip (one-chip design). This holds true also in the module 60a (60b, 60c) shown in FIG. 10. Likewise, the main interface 84 and main diagnosis circuit 85 for composing the module 80 shown in FIG. 16, or the subsidiary interface 86 and subsidiary diagnosis circuit 87 for composing the module 81 are also desired to be structured in one-chip design. The same is also applied to the module 90 shown in FIG. 22.

Figure 24:
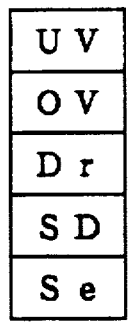
FIG. 24 is a block diagram showing an example of one-chip design in preferred embodiment 6 of the present invention.

In each of the foregoing preferred embodiments 1 to 5, various forms of preferred one-chip design as shown in FIGS. 24 to 27 may be also realized. FIG. 24 is an example of one-chip integration of various circuits coupled to the main circuit element 1, that is, undervoltage detecting circuit UV, overvoltage detecting circuit OV, drive circuit Dr, shutdown circuit SD, and sensing circuit Se. Although not shown, in this example, the drive circuit Dr and shutdown circuit SD coupled to the main circuit element 2 are also integrated in one chip.

Figure 25:
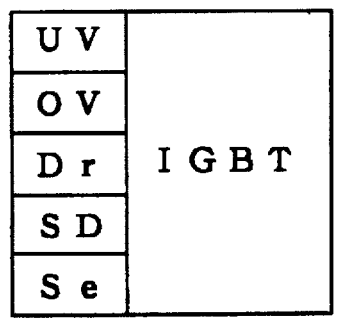
FIG. 25 is a block diagram showing an example of one-chip design in preferred embodiment 6 of the present invention.

FIG. 25 shows an example of one-chip integration of the various circuits shown in FIG. 24, and the IGBT element of the main circuit element 1. Although not shown, the IGBT element of the main circuit element 2 and the drive circuit Dr and shutdown circuit SD coupled thereto are also integrated in one chip.

Figure 26:
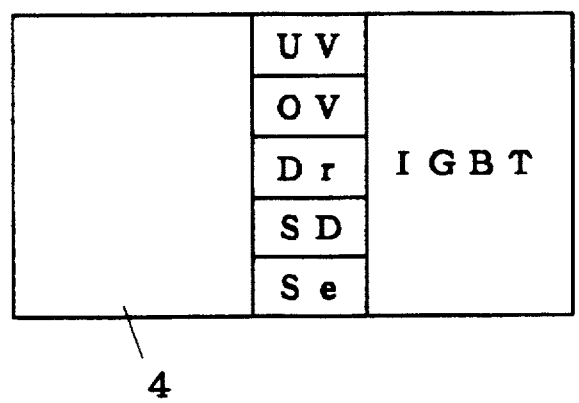
FIG. 26 is a block diagram showing an example of one-chip design in preferred embodiment 6 of the present invention.
Figure 27:
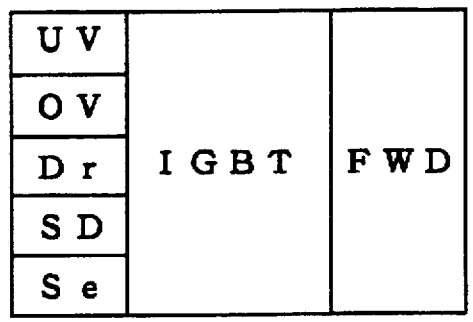
FIG. 27 is a block diagram showing an example of one-chip design in preferred embodiment 6 of the present invention.

FIG. 26 shows a one-chip integration including all circuits spread on the control circuit board 3, in addition to the IGBT element. In FIG. 27, further FWD element is added to the example in FIG. 25 to integrate into one chip.

By such one-chip integration, not only the downsizing and cost reduction of the device may be promoted, but also the reliability of the device may be enhanced.

<7. Modified example>

In the foregoing preferred embodiments, the IGBT elements are used as the semiconductor power switching elements of the semiconductor power modules. Not limited to the IGBT elements, however, other elements may be used, for example, MOSFET, MCT (MOS controled thyristor), current control type bipolar transistor, and others. However, from the viewpoint of simplicity of constitution of drive circuit, it is preferred to use semiconductor power switching elements of voltage control type.

While the invention has been shown and described in detail, the foregoing description is in all aspects illustrative and not restrictive. It is therefore understood that numerous modifications and variations can be devised without departing from the scope of the invention.

We claim:

1. A semiconductor power module comprising:
   a semiconductor power switching element for switching a main current;
   a drive circuit for driving said element;
   a protective circuit for protecting said element from damage when an abnormality occurs;
   plural input terminals;
   an output terminal;
   a selection circuit for selecting a most delayed control signal from among plural control signals applied to said plural input terminals, and for transmitting said most delayed control signal selected to said drive circuit; and
   a transmission route for transmitting one of said plural control signals entered into said selection circuit to said output terminal.

2. A semiconductor power module of claim 1, wherein said selection circuit comprises:
   an AND circuit for receiving said plural control signals,
   a NOR circuit for receiving said plural control signals, and
   an $R_S$ latch circuit for receiving the outputs of said AND circuit and said NOR circuit at a set terminal and a reset terminal, respectively, feeding its output to said drive circuit.

3. A semiconductor power module comprising:
   a semiconductor power switching element for switching a main current;
   a drive circuit for driving said element;
   a protective circuit for protecting said element from damage when an abnormality occurs;
   at least one input terminal coupled to said protective circuit; and
   an output terminal coupled to said protective circuit,
   wherein said protective circuit comprises,
   a shutdown circuit for shutting down said element, prior to the action of said drive circuit, when a shutdown signal is inputted,
   at least one detecting circuit for detecting at least one value of operating parameters associated with said element, and
   a diagnosis circuit, wherein
   said diagnosis circuit comprises,
   at least one comparator for comparing said at least one value of operational parameters associated with said element with respective reference values associated with said operational parameters and outputting a signal corresponding to whether the abnormality has occurred or not, and
   a judging circuit for sending out said shutdown signal to said shutdown circuit, and sending out an abnormality detecting signal to said output terminal, either when any one of said at least one comparator outputs a signal corresponding to occurrence of the abnormality, or when a specific signal is inputted into any one of said at least one input terminal.

4. A semiconductor power module of claim 3,
   wherein said judging circuit comprises an OR circuit for calculating and outputting a logical OR of the output of said at least one comparator, and an input signal to said at least one input terminal.

5. A semiconductor power module of claim 4, wherein:
   said diagnosis circuit further comprises at least one resistance element for each of said at least one input terminal;
   one end of said at least one resistance element is respectively connected to said at least one input terminal; and
   the other end of said at least one resistance element is respectively connected to a potential wire holding an electrical potential corresponding to a normal level of a signal inputted into said at least one input terminal.

6. A semiconductor power module of claim 5, wherein said semiconductor power switching element comprises a transistor element having a sense electrode for outputting a sense current proportional to said main current, said at least one detecting circuit includes a main current detecting circuit, and said main current detecting circuit, defining at least one first resistance element by said at least one resistance element, has a second resistance element connected to said sense electrode, and outputs a voltage generated across said second resistance element.

7. A semiconductor power module of claim 6, wherein said at least one detecting circuit is plural in number, and further includes an overvoltage detecting circuit, and said overvoltage detecting circuit possesses a zener diode having a cathode electrode connected to one of a pair of main electrodes of said transistor element, and outputs a voltage across the pair of main electrodes and limited by a zener voltage of said zener diode.

8. A semiconductor power module of claim 7, wherein said drive circuit comprises an amplifying circuit for outputting a control voltage to a control electrode of said transistor element, in response to a signal inputted into said drive circuit.

9. A semiconductor power module of claim 8, wherein said drive circuit further comprises an input resistance to be connected to the input of said amplifying circuit, and said shutdown circuit possesses a signal route for transmitting the signal inputted into the shutdown circuit to the input of said amplifying circuit, and said signal route is connected to a junction of said input resistance and said amplifying circuit.

10. A semiconductor power module of claim 9, wherein said at least one input terminal is used as at least one first input terminal, and said output terminal is used as a first output terminal, further comprising:

plural second input terminals, a second output terminal, a selection circuit for selecting a control signal most delayed among plural control signals respectively inputted from outside into said plural second input terminals, and transmitting said control signal selected to said drive circuit, and a transmission route for transmitting one of said plural control signals inputted into said selection circuit to said second output terminal.

11. A semiconductor power module of claim 10, wherein said selection circuit comprises:

an AND circuit for receiving said plural control signals, a NOR circuit for receiving said plural control signals, and an $R_S$ latch circuit for receiving the outputs of said AND circuit and said NOR circuit at a set terminal and a reset terminal, respectively, feeding its output to said drive circuit.

12. A semiconductor power module of claim 11, wherein a circuit block comprising said plural detecting circuits, said drive circuit, and said shutdown circuit is integrated in one semiconductor chip.

13. A semiconductor power module of claim 12, wherein said transistor element is further integrated in one semiconductor chip, in addition to the circuit block comprising said plural detecting circuits, said drive circuit, and said shutdown circuit.

14. A semiconductor power module of claim 3, further comprising:

one more input terminal, one more output terminal, and an interface circuit for distributing and transmitting a control signal inputted from outside into said one more input terminal into said drive circuit and said one more output terminal.

15. A semiconductor power module of claim 3, wherein a circuit block comprising said detecting circuit, said drive circuit, and said shutdown circuit is integrated in one semiconductor chip.

16. A semiconductor power module comprising:

a semiconductor power switching element for switching a main current;

a drive circuit for driving said element;

a protective circuit for protecting said element from damage when an abnormality occurs;

an input terminal coupled to said protective circuit; and an output terminal coupled to said protective circuit, wherein said protective circuit comprises, a shutdown circuit for shutting down said element, prior to action of said drive circuit, when a shutdown signal is inputted into said input terminal;

a detecting circuit for detecting a value of at least one operational parameter relating to action of said element; and a diagnosis circuit that comprises, a comparator for comparing said value of the at least one operational parameter with respective reference values and outputting a signal corresponding to whether an abnormality has occurred or not; and a judging circuit for sending out an abnormality detection signal to said output terminal when said comparator outputs a signal corresponding to occurrence of the abnormality.

17. A compound power module comprising plural parallel connected semiconductor power modules connected with each other in parallel, wherein each one of said plural semiconductor power modules comprises a semiconductor power switching element for switching a main current, a drive circuit for driving said element, a protective circuit for protecting said element from damage in the event of abnormality, plural input terminals, an output terminal, a selection circuit for selecting a most delaying control signal among plural control signals entered from outside into said plural input terminals, and transmitting said control signal selected to said drive circuit, and a transmission route for transmitting one of said plural control signals entered in said selection circuit into said output terminal;

the number of said plural semiconductor power modules is not more than the number of said plural input terminals possessed by each one of said plural semiconductor power modules;

one of said plural input terminals of each of said plural semiconductor power modules is mutually connected among said plural semiconductor power modules; and said output terminal of each of said plural semiconductor power modules is connected to one of said plural input terminals other than said one of the same mutually connected of each one of all other semiconductor power modules, so as not to overlap with said output terminal of any other semiconductor power module.

18. A compound power module comprising:

plural semiconductor power modules connected with each other in parallel, wherein each one of said plural semiconductor power modules comprises, a semiconductor power switching element for switching a main current, a drive circuit for driving said element, a protective circuit for protecting said element from damage in the event of an abnormality, at least one input terminal coupled to said protective circuit, and an output terminal coupled to said protective circuit;

said protective circuit further comprising, a shutdown circuit for shutting down said element, prior to the action of said drive circuit, when a shutdown signal is inputted, at least one detecting circuit for detecting at least one value of operating parameters associated with said element; and a diagnosis circuit comprising, at least one comparator for comparing said at least one value of operational parameters associated with said element with respective reference values associated with said operational parameters and outputting a signal corresponding to whether the abnormality has occurred or not, and a judging circuit for sending out said shutdown signal to said shutdown circuit, and sending out an abnormality detecting signal to said output terminal, either when any one of said at least one comparator outputs a signal corresponding to occurrence of the abnormality, or when a specific signal is inputted into any one of said at least one input terminal, wherein a quantity of said plural semiconductor power modules does not exceed by more than 1 a number of said at least one input terminal possessed by each one of said plural semiconductor power modules, and said output terminal of each of said plural semiconductor power modules is connected to one of said at least one input terminal of each one of all other semiconductor power modules, so as not to overlap with said output terminal of any other semiconductor power module.

19. A compound power module comprising:

plural semiconductor power modules connected with each other in parallel, wherein a main module being one of said plural semiconductor modules comprises, a semiconductor power switching element for switching a main current, a drive circuit for driving said element, a protective circuit for protecting said element from damage when an abnormality occurs, at least one input terminal coupled to said protective circuit, and an output terminal coupled to said protective circuit, said protective circuit comprising, a shutdown circuit for shutting down said element, prior to an action of said drive circuit, when a shutdown signal is inputted, at least one detecting circuit for detecting at least one value of operating parameters associated with said element; and a diagnosis circuit comprising, at least one comparator for comparing said at least one value of operational parameters associated with said element with respective reference values associated with said operational parameters and outputting a signal corresponding to whether the abnormality has occurred or not, and a judging circuit for sending out said shutdown signal to said shutdown circuit, and sending out an abnormality detecting signal to said output terminal, either when any one of said at least one comparator outputs a signal corresponding to occurrence of the abnormality, or when a specific signal is inputted into any one of said at least one input terminal, wherein each one of at least one subsidiary modules being the other semiconductor power modules each comprising, a semiconductor power switching element for switching a main current, a drive circuit for driving said element, a protective circuit for each subsidiary module for protecting said element from damage when an abnormality occurs, an input terminal coupled to said protective circuit, and an output terminal coupled to said protective circuit, said protective circuit of each subsidiary module comprising, a shutdown circuit for shutting down said element, prior to action of said drive circuit, when a shutdown signal is inputted into said input terminal, a detecting circuit for detecting a quantity relating to an action of said element, and a diagnosis circuit comprising, a comparator for comparing said quantity detected by the detecting circuit with a reference value, and outputting a signal corresponding to whether an abnormality has occurred or not, and a judging circuit for sending out an abnormality detection signal to said output terminal when said comparator outputs a signal corresponding to occurrence of the abnormality, wherein a number of said at least one subsidiary module being not greater than a number of said at least one input terminal of said main module, said output terminal of said main module being connected to said input terminal of each one of said at least one subsidiary module, and said output terminal of each one of said at least one subsidiary module being connected to one of said input terminals of said main module without overlapping.

20. A compound power module comprising:

plural semiconductor power modules connected with each other in parallel, wherein a main module being one of said plural semiconductor modules comprises, a semiconductor power switching element for switching a main current, a drive circuit for driving said element, a protective circuit for protecting said element from damage in the event of an abnormality, at least one input terminal coupled to said protective circuit, said protective circuit comprising, a shutdown circuit for shutting down said element, prior to the action of said drive circuit, when a shutdown signal is inputted, at least one detecting circuit for detecting at least one value of operating parameters associated with said element, and a diagnosis circuit comprises, at least one comparator for comparing said at least one value of operational parameters associated with said element with respective reference values associated with said operational parameters and outputting a signal corresponding to whether the abnormality has occurred or not; and a judging circuit for sending out said shutdown signal to said shutdown circuit, and sending out an abnormality detecting signal to said output terminal, either when any one of said at least one comparator outputs a signal corresponding to occurrence of the abnormality, or when a specific signal is inputted into any one of said at least one input terminal.

said main module further comprises, one more input terminal, one more output terminal, and an interface circuit for distributing and transmitting the control signal inputted from outside into said one more input terminal into said drive circuit and said one more output terminal, each one of at least one subsidiary modules being the other semiconductor power modules each comprising, a semiconductor power switching element for switching a main current, a drive circuit for driving said element, a protective circuit for protecting said element from damage in the event of the abnormality, an input terminal coupled to said protective circuit, and an output terminal coupled to said protective circuit, said protective circuit comprising, a shutdown circuit for shutting down said element, prior to action of said drive circuit, when a shutdown signal is inputted into said input terminal;

a detecting circuit for detecting a quantity relating to an action of said element, and a diagnosis circuit comprising, a comparator for comparing at least one value of operational parameters of said element with respective reference values associated with said operational parameters and outputting a signal corresponding to whether an abnormality has occurred or not, and a judging circuit for sending out an abnormality detection signal to said output terminal when said comparator outputs a signal corresponding to occurrence of the abnormality, the number of said at least one subsidiary module being not more in number than said at least one input terminal of said main module, said output terminal of said main module being connected to said input terminal of each one of said at least one subsidiary module, said output terminal of each one of said at least one subsidiary module being connected to one of said input terminals of said main module without overlapping, and said one more output terminal of said main module being coupled with said drive circuit of each one of said at least one subsidiary module.

* * * * *